US011769781B2

(12) United States Patent
Lin et al.

(10) Patent No.: US 11,769,781 B2
(45) Date of Patent: *Sep. 26, 2023

(54) BACKSIDE ILLUMINATED GLOBAL SHUTTER IMAGE SENSOR

(71) Applicant: Taiwan Semiconductor Manufacturing Co., Ltd., Hsin-Chu (TW)

(72) Inventors: Jeng-Shyan Lin, Tainan (TW); Shu-Ting Tsai, Kaohsiung (TW); Tzu-Hsuan Hsu, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 217 days.

This patent is subject to a terminal disclaimer.

(21) Appl. No.: 17/324,373

(22) Filed: May 19, 2021

(65) Prior Publication Data
US 2021/0272989 A1    Sep. 2, 2021

Related U.S. Application Data

(63) Continuation of application No. 16/556,654, filed on Aug. 30, 2019, now Pat. No. 11,018,177.
(Continued)

(51) Int. Cl.
*H01L 27/146* (2006.01)

(52) U.S. Cl.
CPC ...... *H01L 27/1464* (2013.01); *H01L 27/1463* (2013.01); *H01L 27/14616* (2013.01); *H01L 27/14627* (2013.01); *H01L 27/14636* (2013.01)

(58) Field of Classification Search
CPC ............ H01L 27/1464; H01L 27/1463; H01L 27/14616
See application file for complete search history.

(56) References Cited

U.S. PATENT DOCUMENTS 9,048,164 B2 * 6/2015 Suzuki ................ H04N 25/713
10,204,964 B1 2/2019 Lee et al.
(Continued)

OTHER PUBLICATIONS

Non-Final Office Action dated Oct. 29, 2020 for U.S. Appl. No. 16/556,654.
(Continued)

*Primary Examiner* — Dale E Page
*Assistant Examiner* — Wilner Jean Baptiste
(74) *Attorney, Agent, or Firm* — Eschweiler & Potashnik, LLC

(57) ABSTRACT

Various embodiments of the present disclosure are directed towards an image sensor. The image sensor includes a photodetector disposed in a semiconductor substrate. An interlayer dielectric (ILD) structure is disposed on a first side of the semiconductor substrate. A storage node is disposed in the semiconductor substrate and spaced from the photodetector, where the storage node is spaced from the first side by a first distance. A first isolation structure is disposed in the semiconductor substrate and between the photodetector and the storage node, where the first isolation structure extends into the semiconductor substrate from a second side of the semiconductor substrate that is opposite the first side, and where the first isolation structure is spaced from the first side by a second distance that is less than the first distance.

20 Claims, 16 Drawing Sheets

Related U.S. Application Data

(60) Provisional application No. 62/853,738, filed on May 29, 2019.

(56) References Cited

U.S. PATENT DOCUMENTS

| | | |
|---|---|---|
| 10,432,883 B1 | 10/2019 | Chapman et al. |
| 11,510,750 B2 * | 11/2022 | Dulin .................... A61B 90/36 |
| 2014/0246707 A1 | 9/2014 | Koo et al. |

OTHER PUBLICATIONS

Notice of Allowance dated Jan. 27, 2021 for U.S. Appl. No. 16/556,654.

* cited by examiner

2100 ⬉

| 2102 | Form a photodetector and a storage node in a first semiconductor substrate, wherein the first semiconductor substrate comprises a front side and a back side opposite the front side |

↓

| 2104 | Form a plurality of gates on the front side of the semiconductor substrate, wherein the plurality of gates comprise a first vertical transfer gate and a second vertical transfer gate that extend into the semiconductor substrate from the front side |

↓

| 2106 | Form a floating diffusion node, a first doped region, and a second doped region in the first semiconductor substrate |

↓

| 2108 | Form an interlayer dielectric (ILD) structure on the front side of the first semiconductor substrate and over the plurality of gates |

↓

| 2110 | Bond a second semiconductor substrate to the first semiconductor substrate, wherein the ILD structure separates the first semiconductor substrate from the second semiconductor substrate |

↓

| 2112 | Form an isolation structure in the first semiconductor substrate that extends into the first semiconductor substrate from the back side of the first semiconductor substrate |

↓

| 2114 | Form a reflective structure on the back side of the first semiconductor substrate, wherein at least a portion of the reflective structure is disposed between opposite sides of the storage node |

Fig. 21

BACKSIDE ILLUMINATED GLOBAL SHUTTER IMAGE SENSOR

REFERENCE TO RELATED APPLICATIONS

This application is a Continuation of U.S. application Ser. No. 16/556,654, filed on Aug. 30, 2019, which claims the benefit of U.S. Provisional Application No. 62/853,738, filed on May 29, 2019. The contents of the above-referenced patent applications are hereby incorporated by reference in their entirety.

BACKGROUND

Many modern day electronic devices (e.g., smartphones, digital cameras, biomedical imaging devices, automotive imaging devices, etc.) comprise image sensors. The image sensors comprise one or more photodetectors (e.g., photodiodes, phototransistors, photoresistors, etc.) configured to absorb incident radiation and output electrical signals corresponding to the incident radiation. Some types of image sensors include charge-coupled device (CCD) image sensors and complementary metal-oxide-semiconductor (CMOS) image sensors. Compared to CCD image sensors, CMOS image sensors are favored due to low power consumption, small size, fast data processing, a direct output of data, and low manufacturing cost. Some types of CMOS image sensors include front-side illuminated (FSI) image sensors and backside illuminated (BSI) image sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 21 illustrates a flowchart of some embodiments of a method for forming a BSIGS image sensor.

DETAILED DESCRIPTION

Figure 1:
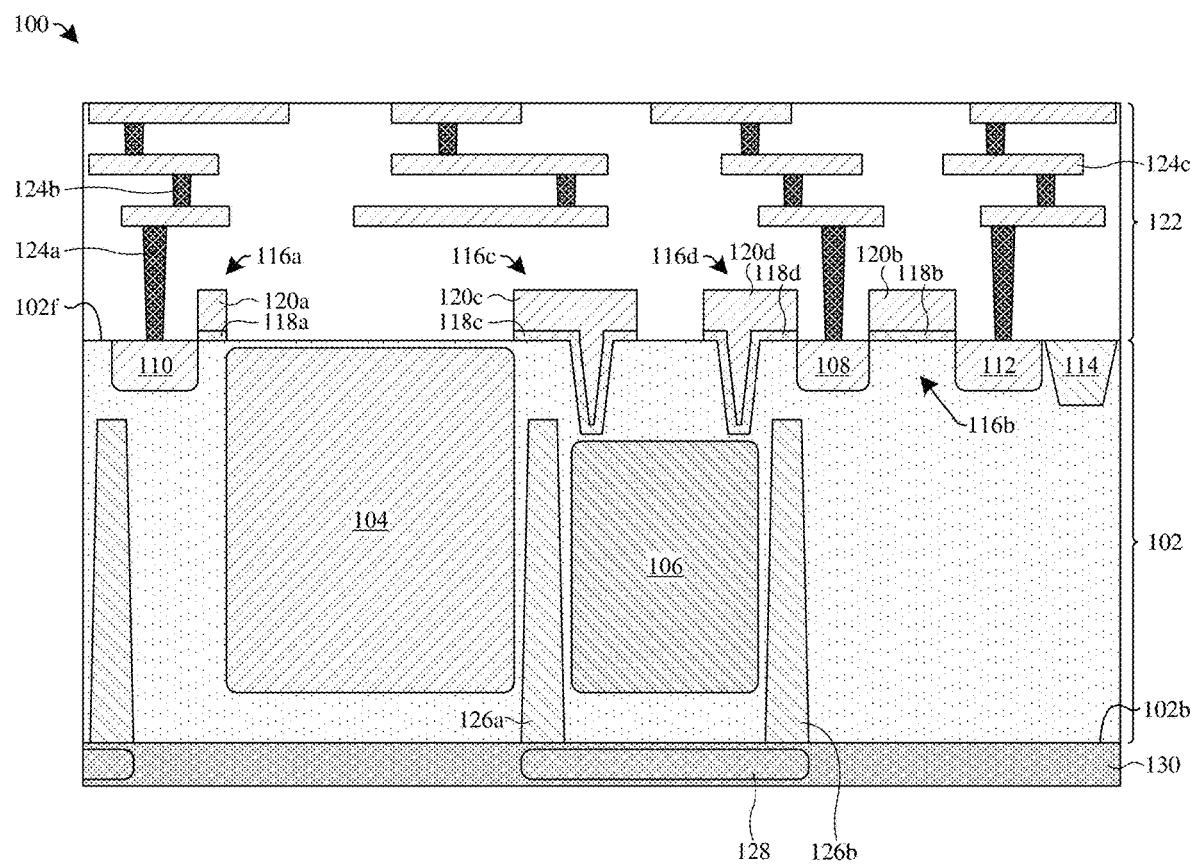
FIG. 1 illustrates a cross-sectional view of some embodiments of a backside illuminated global shutter (BSIGS) image sensor.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some complementary metal-oxide semiconductor image sensors (CISs) have an array of pixel sensors. A pixel sensor records incident radiation using a photodetector, and facilitates digital readout of the recording with a plurality of pixel devices (e.g., a transfer gate, a reset transistor, a source follower transistor, and/or a row-select transistor). Some CISs are global shutter (GS) CISs. A GSCIS is configured to start and stop exposure of each of the pixel sensors at a same time. For example, the GSCIS may start an exposure of an optical image to each of the pixel sensors at a same first time, and then the GSCIS may stop the exposure of the optical image to each of the pixels at a same second time. Some GSCISs are front-side illuminated (FSI) GSCISs. A FSIGSCIS is configured to record incident radiation that passes through a front-side of a semiconductor substrate. For example, an interlayer dielectric (ILD) structure may be disposed on a front-side of a semiconductor substrate, and the FSIGSCIS is configured to record incident radiation that passes through the ILD structure and the front-side of the semiconductor substrate.

One challenge with the above FSIGSCIS is improving quantum efficiency (QE) and/or angular response (AR) of the FSIGSCIS while maintaining high shutter efficiency (SE). Because the FSIGSCIS is configured to record incident radiation that passes through the front-side of the semiconductor substrate, the FSIGSCIS has a relatively long optical path that negatively impacts QE and/or AR of the FSIGSCIS. Further, because the FSIGSCIS is configured to record incident radiation that passes through the front-side of the semiconductor substrate, an interconnect structure disposed in the ILD structure may reflect some of the incident radiation, thereby negatively impacting QE and/or AR of the FSIGSCIS. While the interconnect structure may negatively impact QE and/or AR of the FSIGSCIS, the interconnect structure may shield a storage node of the FSIGSCIS from most of the incident radiation, thereby positively impacting SE.

Various embodiments of the present application are directed toward a backside illuminated global shutter (BSIGS) image sensor. The BSIGS image sensor is configured to record incident radiation that passes through a back side of the semiconductor substrate. The BSIGS image sensor comprises a photodetector disposed in the semiconductor substrate. A storage node is disposed in the semiconductor substrate and spaced from the photodetector. An interconnect structure is disposed on a front side of the semiconductor substrate. A reflective structure is disposed on the back side of the semiconductor substrate opposite the front side. The reflective structure is disposed such that the reflective structure at least partially shields the storage node from incident radiation passing through the back side of the semiconductor substrate.

Because the BSIGS image sensor is configured to record incident radiation that passes through the backside of the semiconductor substrate, when compared to a FSIGSCIS, the BSIGS image sensor may have better QE and/or AR due to the BSIGS image sensor having a shorter optical path than a FSIGSCIS. Further, because the BSIGS image sensor is configured to record incident radiation that passes through the backside of the semiconductor substrate, when compared to a FSIGSCIS, the BSIGS image sensor may have better QE and/or AR due to a reduction (or elimination) of incident radiation reflected by the interconnect structure. Moreover, because the reflective structure at least partially shields the storage node from incident radiation passing through the back side of the semiconductor substrate, the BSIGS image sensor may have a high SE. Accordingly, the BSIGS image sensor may have improved QE and/or AR over an FSIGSCIS while maintaining high SE.

FIG. 1 illustrates a cross-sectional view of some embodiments of a backside illuminated global shutter (BSIGS) image sensor 100.

As shown in FIG. 1, the BSIGS image sensor 100 comprises a first semiconductor substrate 102. The first semiconductor substrate 102 has a front side 102f and a back side 102b opposite the front side 102f. The first semiconductor substrate 102 may comprise any type of semiconductor body (e.g., monocrystalline silicon/CMOS bulk, silicon-germanium (SiGe), silicon on insulator (SOI), etc.). The BSIGS image sensor 100 is configured to record incident radiation (e.g., photons) that pass through the back side 102b of the first semiconductor substrate 102.

A photodetector 104 (e.g., photodiode) is disposed in the first semiconductor substrate 102. The photodetector 104 comprises a portion of the first semiconductor substrate 102 having a first doping type (e.g., n-type/p-type). In some embodiments, portions of the first semiconductor substrate 102 adjoining the photodetector 104 may have a second doping type opposite the first doping type (e.g., p-type/n-type), or may be intrinsic. The photodetector 104 is configured to absorb the incident radiation (e.g., light) and generate electrical signals corresponding to the incident radiation.

A storage node 106 is disposed in the first semiconductor substrate 102 and spaced from the photodetector 104. The storage node 106 is a region of the first semiconductor substrate 102 having the first doping type. The storage node 106 is configured to store charges transferred to the storage node 106 from the photodetector 104.

A floating diffusion node 108 is disposed in the first semiconductor substrate 102 and laterally spaced from both the photodetector 104 and the storage node 106. The floating diffusion node 108 is a region of the first semiconductor substrate 102 having the first doping type. A first doped region 110 is disposed in the first semiconductor substrate 102 and spaced from the floating diffusion node 108. The first doped region 110 is a region of the first semiconductor substrate having the first doping type. In some embodiments, the first doped region 110 is a source/drain region for an anti-blooming (AB) gate. A second doped region 112 is disposed in the first semiconductor substrate 102 and spaced from both the first doped region 110 and the floating diffusion node 108. The second doped region 112 is a region of the first semiconductor substrate having the first doping type. In some embodiments, the second doped region 112 is a source/drain region of a reset transistor. In yet further embodiments, a first isolation structure 114 (e.g., shallow trench isolation (STI) structure) is disposed in the first semiconductor substrate 102.

A plurality of gates 116 are disposed on the front side 102f of the first semiconductor substrate 102. For example, a first gate 116a, a second gate 116b, a first vertical transfer gate 116c, and a second vertical transfer gate 116d may be disposed on the front side 102f of the first semiconductor substrate 102. The first vertical transfer gate 116c is configured to selectively form a first conductive channel between the photodetector 104 and the storage node 106, such that charges accumulated in the photodetector 104 (e.g., via absorbing the incident radiation) may be transferred to the storage node 106. The second vertical transfer gate 116d is configured to selectively form a second conductive channel between the storage node 106 and the floating diffusion node 108, such that charges stored in the storage node 106 may be transferred to the floating diffusion node 108. In some embodiments, the first gate 116a may be an AB gate, and the second gate 116b may be a reset gate.

The first vertical transfer gate 116c and the second vertical transfer gate 116d extend into the first semiconductor substrate 102 from the front side 102f. For example, a first portion of the first vertical transfer gate 116c is disposed over the front side 102f and a second portion of the first vertical transfer gate 116c extends into the first semiconductor substrate 102 from the front side 102f. The plurality of gates 116 comprise gate dielectrics 118, respectively, and comprise gate electrodes 120 disposed on the gate dielectrics 118, respectively. For example, the first gate 116a comprises a first gate dielectric 118a and a first gate electrode 120a disposed on the first gate dielectric 118a, the second gate 116b comprises a second gate dielectric 118b and a second gate electrode 120b disposed on the second gate dielectric 118b, the first vertical transfer gate 116c comprises a third gate dielectric 118c and a third gate electrode 120c disposed on the third gate dielectric 118c, and the second vertical transfer gate 116d comprises a fourth gate dielectric 118d and a fourth gate electrode 120d disposed on the fourth gate dielectric 118d.

A first interlayer dielectric (ILD) structure 122 is disposed over the front side 102f of the first semiconductor substrate 102. A first interconnect structure 124 (e.g., copper interconnect) is disposed in the first ILD structure 122. The first interconnect structure 124 comprises a plurality of conductive contacts 124a (e.g., metal contacts), a plurality of conductive vias 124b (e.g., metal vias), and a plurality of conductive wires 124c (e.g., metal wires). In some embodiments, the first ILD structure 122 comprises one or more stacked ILD layers, which may respectively comprise a low-k dielectric (e.g., a dielectric material with a dielectric constant less than about 3.9), an oxide (e.g., silicon dioxide ($SiO_2$)), or the like. In further embodiments, the first interconnect structure 124 may comprise, for example, copper (Cu), aluminum (Al), tungsten (W), gold (Au), some other conductive material, or a combination of the foregoing. In yet further embodiments, the conductive contacts 124a may comprise a first conductive material (e.g., W), and the conductive vias 124b and the conductive wires 124c may comprise a second conductive material (e.g., Cu) different than the first conductive material.

A second isolation structure 126 (e.g., a back-side deep trench isolation (BDTI) structure) is disposed in the first semiconductor substrate 102. The second isolation structure 126 is less transparent than the first semiconductor substrate 102. The second isolation structure 126 extends into the first semiconductor substrate 102 from the back side 102b of the first semiconductor substrate 102 and along the storage node 106. A first portion of the second isolation structure 126a extends into the first semiconductor substrate 102 between the storage node 106 and the photodetector 104. A second portion of the second isolation structure 126b extends into the first semiconductor substrate 102 on an opposite side of the storage node 106 as the first portion of the second isolation structure 126a. The first portion of the second isolation structure 126a may be referred to as a third isolation structure, and the second portion of the second isolation structure 126b may be referred to as a fourth isolation structure. Because the second isolation structure 126 extends into the first semiconductor substrate 102 and along the storage node 106, the second isolation structure 126 may at least partially shield the storage node 106 from the incident radiation.

In some embodiments, both the first vertical transfer gate 116c and the second vertical transfer gate 116d are at least partially disposed between the first portion of the second isolation structure 126a and the second portion of the second isolation structure 126b. Because the first vertical transfer gate 116c extends into the first semiconductor substrate 102, and because the first vertical transfer gate 116c is at least partially disposed between the first portion of the second isolation structure 126a and the second portion of the second isolation structure 126b, the first vertical transfer gate 116c may improve charge transfer between the photodetector 104 and the storage node 106. Because the second vertical transfer gate 116d extends into the first semiconductor substrate 102, and because the second vertical transfer gate 116d is at least partially disposed between the first portion of the second isolation structure 126a and the second portion of the second isolation structure 126b, the second vertical transfer gate 116d may improve charge transfer between the storage node 106 and the floating diffusion node 108. Also, because the first vertical transfer gate 116c and the second vertical transfer gate 116d are at least partially disposed between the first portion of the second isolation structure 126a and the second portion of the second isolation structure 126b, the first vertical transfer gate 116c and/or the second vertical transfer gate 116d may at least partially shield the storage node 106 from the incident radiation.

In some embodiments, the second isolation structure 126 is a continuous structure. In other embodiments, the second isolation structure 126 may comprise discrete portions. For example, the first portion of the second isolation structure 126a may be discrete from the second portion of the second isolation structure 126b. In further embodiments, the first vertical transfer gate 116c and the second vertical transfer gate 116d are at least partially disposed within an inner perimeter of the second isolation structure 126. In yet further embodiments, both the floating diffusion node 108 are disposed outside the inner perimeter of the second isolation structure 126. In further embodiments, the second isolation structure 126 may comprise an oxide (e.g., $SiO_2$), a nitride (e.g., silicon nitride (SiN)), an oxy-nitride (e.g., silicon oxy-nitride ($SiO_XN_Y$)), a carbide (e.g., silicon carbide (SiC)), or the like.

A reflective structure 128 is disposed on the back side 102b of the first semiconductor substrate 102. The reflective structure 128 is less transparent than the first semiconductor substrate 102. In some embodiments, the reflective structure 128 may comprise, for example, W, Al, Cu, some other metal, or a combination of the foregoing. In further embodiments, the reflective structure 128 may be embedded in a dielectric structure 130. In yet further embodiments, the reflective structure 128 is referred to as a metal structure.

The reflective structure 128 is at least partially offset from the photodetector 104 in a lateral direction. In other words, at least a portion of the photodetector 104 is disposed outside an outer perimeter of the reflective structure 128. At least a portion of the reflective structure 128 is disposed between opposite sides of the storage node 106. In some embodiments, opposite sides of the storage node 106 are disposed between opposite sidewalls of the reflective structure 128. In further embodiments, an outer perimeter of the storage node 106 is disposed within an outer perimeter of the reflective structure 128. Because at least a portion or the reflective structure 128 is disposed between opposite sides of the storage node 106, the reflective structure 128 may at least partially shield the storage node 106 from the incident radiation.

Because the BSIGS image sensor 100 is configured to record incident radiation that passes through the back side 102b of the first semiconductor substrate 102, when compared to a front-side illuminated global shutter (FSIGS) image sensor, the BSIGS image sensor 100 may have better quantum efficiency (QE) and/or angular response (AR). Further, because the reflective structure 128 at least partially shields the storage node 106 from the incident radiation, the BSIGS image sensor 100 may have a high shutter efficiency (SE). In addition, the second isolation structure 126 may contribute to high SE of the BSIGS image sensor 100 by at least partially shielding the storage node 106 from the incident radiation. Moreover, the first vertical transfer gate 116c and/or the second vertical transfer gate 116d may contribute to the high SE of the BSIGS image sensor 100 by at least partially shielding the storage node 106 from the incident radiation. Accordingly, the BSIGS image sensor 100 may have improved QE and/or AR over an FSIGS image sensor while also having high SE.

Figure 2:
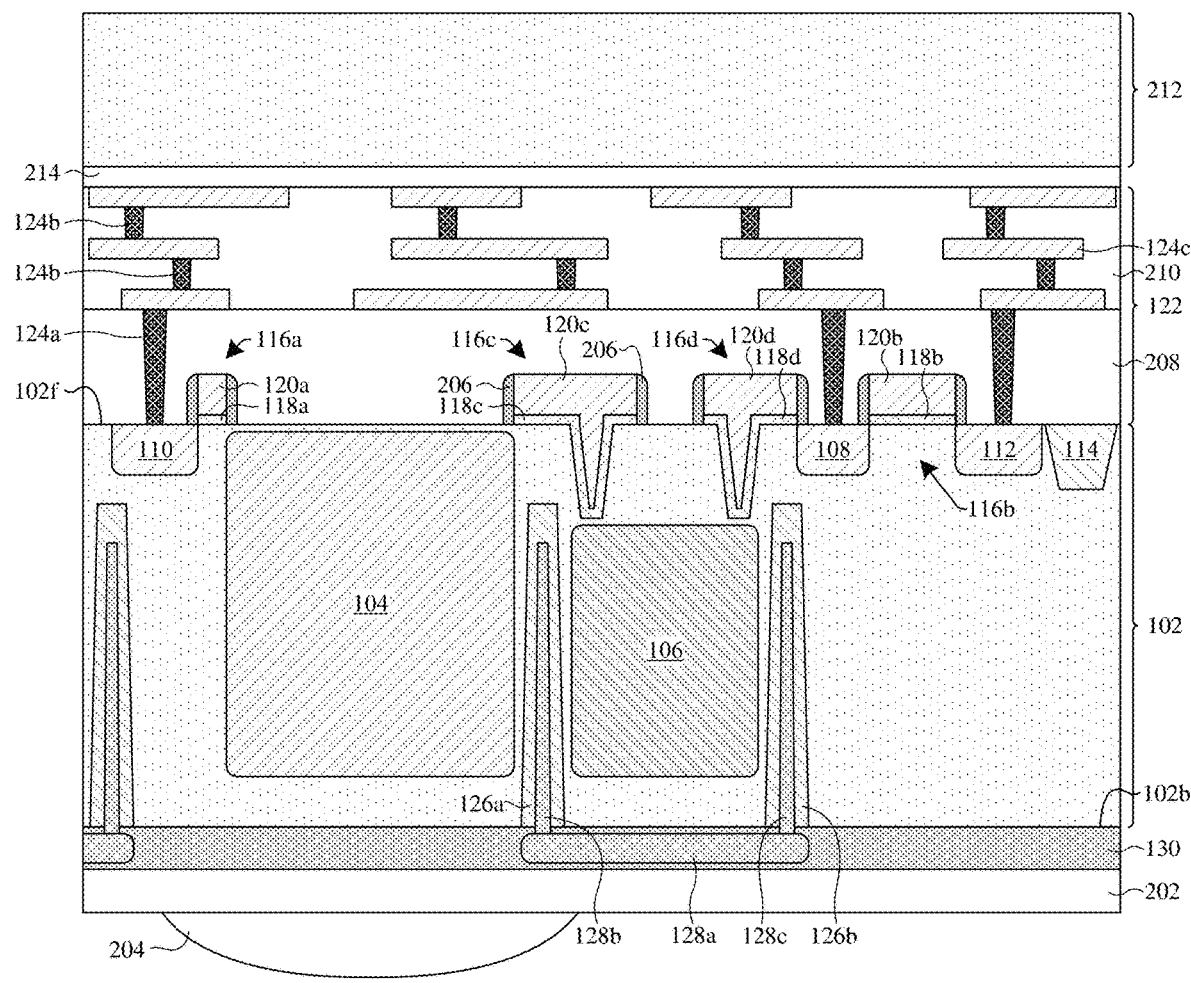
FIG. 2 illustrates a cross-sectional view of some other embodiments of the BSIGS image sensor of FIG. 1.

FIG. 2 illustrates a cross-sectional view of some other embodiments of the BSIGS image sensor 100 of FIG. 1.

As shown in FIG. 2, a light filter 202 (e.g., an infrared light filter, a red color filter, a blue color filter, a green color filter, etc.) is disposed on the dielectric structure 130. The light filter 202 is configured to transmit a specific wavelength (or range of wavelengths) of the incident radiation. It will be appreciated that, in some embodiments, the light filter 202 is one of a plurality of light filters disposed in a light filter array. In such embodiments, the plurality of light filters may be configured to transmit specific wavelengths (or specific ranges of wavelengths), respectively. For example, a first light filter (e.g., the red color filter) may transmit light having wavelengths within a first range, while a second light filter (e.g., the blue color filter) may transmit light having wavelengths within a second range different than the first range.

In some embodiments, both the dielectric structure 130 and the reflective structure 128 are disposed between the light filter 202 and the first semiconductor substrate 102. In other embodiments, the light filter 202 may be disposed between the first semiconductor substrate 102 and both the dielectric structure 130 and the reflective structure 128. The dielectric structure 130 may comprise, for example, an oxide (e.g., $SiO_2$), a nitride (e.g., SiN), an oxy-nitride (e.g., $SiO_XN_Y$), a high-k dielectric (e.g., hafnium oxide ($HfO_2$), zirconium oxide ($ZrO_2$), or some other dielectric material with a dielectric constant greater than about 3.9), some other dielectric material, or a combination of the foregoing. In further embodiments, the dielectric structure 130 may comprise a first layer comprising an oxide stacked on a second layer comprising a high-k dielectric, or vice versa.

In some embodiments, the dielectric structure 130 may be a BSI anti-reflection structure that is configured to reduce an amount of the incident radiation reflected by the first semiconductor substrate 102. In other embodiments, the dielectric structure 130 may be distinct from a BSI anti-refection structure. In such embodiments, the BSI anti-reflection structure may be disposed between the dielectric structure 130 and the first semiconductor substrate 102, or the dielectric structure 130 may be disposed between the anti-reflection structure and the first semiconductor substrate 102.

For a FSIGS image sensor having a FSI anti-reflection structure, the FSI anti-reflection structure is disposed on a front side of a semiconductor substrate. However, this orientation limits the ability to optimize the FSI anti-reflection structure to improve QE and/or AR. However, because the BSIGS image sensor 100 is configured to record the incident radiation that passes through the back side 102b of the first semiconductor substrate 102, the BSI anti-reflection structure is disposed on the back side 102b of the first semiconductor substrate 102. Because the BSI anti-reflection structure is disposed on the back side 102b of the first semiconductor substrate 102, when compared to a FSIGS image sensor, the BSIGS image sensor 100 may have better QE and/or AR due to the ability to better optimize the BSI anti-reflection structure.

In some embodiments, a micro-lens 204 is disposed on the back side 102b of the first semiconductor substrate 102. In further embodiments, the micro-lens 204 is disposed on the light filter 202. The micro-lens 204 is configured to focus the incident radiation towards the photodetector 104. It will be appreciated that, in some embodiments, the micro-lens 204 is one of a plurality of micro-lenses that are configured to focus the incident radiation toward a plurality of photodetectors, respectively.

In some embodiments, the reflective structure 128 comprises a first portion of the reflective structure 128a, a second portion of the reflective structure 128b, and a third portion of the reflective structure 128c. In further embodiments, both the second portion of the reflective structure 128b and the third portion of the reflective structure 128c are coupled to the first portion of the reflective structure 128a, such that the reflective structure 128 is a continuous structure. In some embodiments, the first portion of the reflective structure 128a may have rounded sidewalls.

The second portion of the reflective structure 128b and the third portion of the reflective structure 128c extend into the first semiconductor substrate 102 from the back side 102b. The second portion of the reflective structure 128b may be disposed in the first portion of the second isolation structure 126a. The third portion of the reflective structure 128c may be disposed in the second portion of the second isolation structure 126b. In some embodiments, the reflective structure 128 is less transparent than the second isolation structure 126. Because the second portion of the reflective structure 128b and the third portion of the reflective structure 128c extend into the first semiconductor substrate 102 and along the storage node 106, and because the reflective structure 128 is less transparent than the second isolation structure 126, the reflective structure 128 may further shield the storage node 106 from the incident radiation. Accordingly, the reflective structure 128 may further increase SE of the BSIGS image sensor 100.

In some embodiments, the second portion of the reflective structure 128b and/or the third portion of the reflective structure 128c is at least partially disposed in the dielectric structure 130. In further embodiments, both the second portion of the reflective structure 128b and the third portion of the reflective structure 128c may be disposed between opposite sidewalls of the first portion of the reflective structure 128a. The second portion of the reflective structure 128b and the third portion of the reflective structure 128c may have angled sidewall. In yet further embodiments, the first portion of the second isolation structure 126a and the second portion of the second isolation structure 126b may have angled sidewalls.

A plurality of sidewall spacers 206 are disposed along sidewalls of the plurality of gates 116, respectively. For ease of illustration, only one of the sidewall spacers 206 is labeled. In some embodiments, each of the sidewall spacers 206 are disposed along sidewalls of a corresponding one of the gate dielectrics 118 and a corresponding one of the gate electrodes 120. For example, one of the sidewall spacers 206 is disposed on the front side 102f of the first semiconductor substrate 102 and along sidewalls of the third gate dielectric 118c and sidewalls of the third gate electrode 120c. In some embodiments, the sidewall spacers 206 may comprise, for example, a nitride (e.g., SiN), an oxy-nitride (e.g., $SiO_xN_y$), or the like. In further embodiments, the gate dielectrics 118 may comprise, for example, an oxide (e.g., $SiO_2$), a high-k dielectric material (e.g., $HfO_2$, $ZrO_2$, or some other dielectric material with a dielectric constant greater than about 3.9), or the like. In yet further embodiments, the gate electrodes 120 may comprise, for example, polysilicon (e.g., doped/undoped polysilicon), a metal (e.g., W, Al, titanium (Ti), molybdenum (Mo), or the like), or the like.

The first ILD structure 122 may comprise a second ILD structure 208 and a third ILD structure 210. The second ILD structure 208 is disposed over the front side 102f of the first semiconductor substrate 102 and over the plurality of gates 116. The conductive contacts 124a are disposed in the second ILD structure 208. In some embodiments, the second ILD structure 208 comprises one or more ILD layers, which may respectively comprise a low-k dielectric (e.g., a dielectric material with a dielectric constant less than about 3.9), an oxide (e.g., $SiO_2$), or the like.

The third ILD structure 210 is disposed over the second ILD structure 208 and the conductive contacts 124a. The conductive vias 124b and the conductive wires 124c are disposed in the third ILD structure 210. In some embodiments, the third ILD structure 210 comprises one or more ILD layers, which may respectively comprise a low-k dielectric (e.g., a dielectric material with a dielectric constant less than about 3.9), an oxide (e.g., $SiO_2$), or the like.

In some embodiments, a second semiconductor substrate 212 is disposed over the first ILD structure 122, the first interconnect structure 124, and the front side 102f of the first semiconductor substrate 102. The second semiconductor substrate 212 may comprise any type of semiconductor body (e.g., monocrystalline silicon/CMOS bulk, SiGe, SOI, etc.). In further embodiments, the second semiconductor substrate 212 is bonded to the first ILD structure 122 via a bonding structure 214. In other embodiments, the second semiconductor substrate 212 is bonded directly to the first ILD structure 122. It will be appreciated that, in some embodiments, a plurality of conductive features (e.g., bond pads, metal vias, metal lines, through-substrate vias, etc.) may be disposed in the bonding structure 214 and/or the second semiconductor substrate 212, thereby providing an electrical connection between the first interconnect structure 124 and one or more input/output (I/O) structures (e.g., contact pads, solder bumps, etc.). In yet further embodiments, the second semiconductor substrate 212 may be referred to as a carrier substrate.

Also shown in FIG. 2, the photodetector 104 is spaced from the front side 102f of the first semiconductor substrate 102 by a first distance. The storage node 106 is spaced from the front side 102f of the first semiconductor substrate 102 by a second distance greater than the first distance. The second isolation structure 126 is spaced from the front side 102f of the first semiconductor substrate 102 by a third distance. In some embodiments, the third distance is greater than the first distance and less than the second distance. In other embodiments, the third distance may be less than or equal to the first distance or greater than or equal to the second distance. In further embodiments, the second portion of the reflective structure 128b and/or the third portion of the reflective structure 128c is spaced from the front side 102f of the first semiconductor substrate 102 by a fourth distance that is greater than the third distance. In yet further embodiments, the fourth distance may be greater than or equal to the second distance. In other embodiments, the fourth distance may be greater than the first distance and less than the second distance. In yet other embodiments, the fourth distance may be less than or equal to the first distance.

A bottommost surface of the first vertical transfer gate 116c and/or a bottommost surface of the second vertical transfer gate 116d is spaced from the front side 102f of the first semiconductor substrate 102 by a fifth distance. In some embodiments, the fifth distance is less than the second distance. The fifth distance may be greater than the third distance and less than the fourth distance. In some embodiments, the fifth distance is less than or equal to the third distance. In other embodiments, the fifth distance is greater than or equal to the third distance.

Also shown in FIG. 2, the first vertical transfer gate 116c extends a first depth into the first semiconductor substrate 102. The first depth is a distance between the front side 102f of the first semiconductor substrate 102 and a bottommost surface of the third gate dielectric 118c. In some embodiments, the first depth is between about 0.5 micrometers (um) and about 2 um.

The portion of the first vertical transfer gate 116c that is disposed in the first semiconductor substrate 102 has a first width. The first width is a width between opposite outer sidewalls of the third gate dielectric 118c that are disposed in the first semiconductor substrate 102. In some embodiments, the first width is a greatest width between opposite outer sidewalls of the third gate dielectric 118c that are disposed in the first semiconductor substrate 102. In further embodiments, the first width is between about 0.1 um and about 0.4 um.

The second vertical transfer gate 116d extends a second depth into the first semiconductor substrate 102. The second depth is a distance between the front side 102f of the first semiconductor substrate 102 and a bottommost surface of the fourth gate dielectric 118d. In some embodiments, the first depth is between about 0.5 um and about 2 um. In further embodiments, the second depth is substantially the same as the first depth. In other embodiments, the second depth is different than the first depth.

The portion of the second vertical transfer gate 116d that is disposed in the first semiconductor substrate 102 has a second width. The second width is a width between opposite outer sidewalls of the fourth gate dielectric 118d that are disposed in the first semiconductor substrate 102. In some embodiments, the second width is a greatest width between opposite outer sidewalls of the fourth gate dielectric 118d that are disposed in the first semiconductor substrate 102. In further embodiments, the second width is between about 0.1 um and about 0.4 um. In yet further embodiments, the second width is substantially the same as the first width. In other embodiments, the second width is different than the first width.

Figure 3:
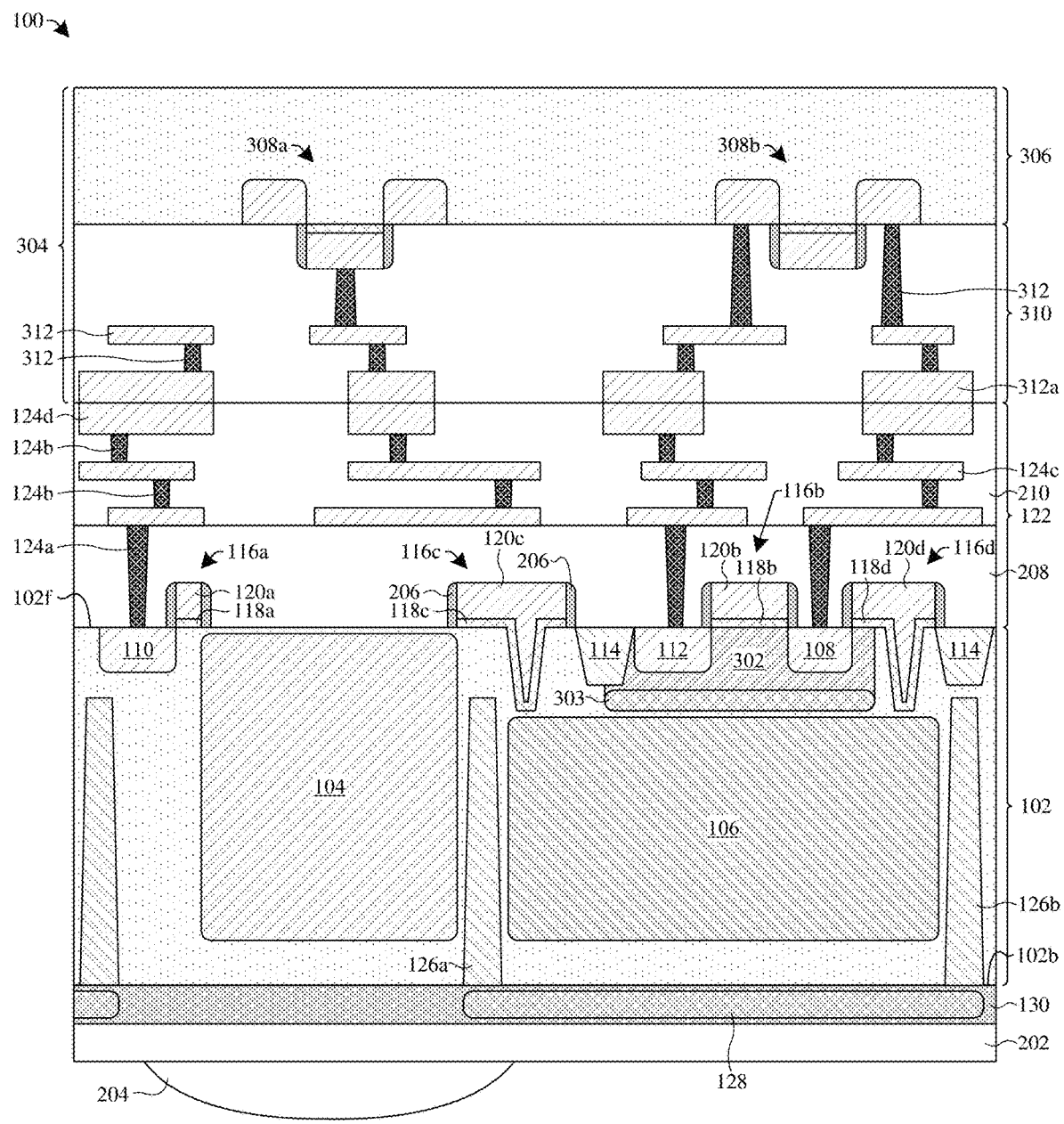
FIG. 3 illustrates a cross-sectional view of some other embodiments of the BSIGS image sensor of FIG. 1.

FIG. 3 illustrates a cross-sectional view of some other embodiments of the BSIGS image sensor 100 of FIG. 1.

As shown in FIG. 3, in some embodiments, the second gate 116b is disposed directly over the storage node 106. The second gate 116b may be disposed between the first vertical transfer gate 116c and the second vertical transfer gate 116d. In further embodiments, the floating diffusion node 108 and/or the second doped region 112 may be directly disposed over the storage node 106. The floating diffusion node 108 and/or the second doped region 112 may be disposed between the first vertical transfer gate 116c and the second vertical transfer gate 116d.

A doped well 302 is disposed in the first semiconductor substrate 102. The doped well 302 is a region of the first semiconductor substrate having the second doping type. In some embodiments, the doped well 302 has a higher doping concentration of second doping type dopants (e.g., p-type dopants) than adjoining regions of the first semiconductor substrate 102. In further embodiments, the second doped region 112 and/or the floating diffusion node 108 are disposed between opposite sides of the doped well 302.

In some embodiments, the doped well 302 is disposed directly between the second gate 116b and the storage node 106, directly between the second doped region 112 and the storage node 106, and directly between the floating diffusion node 108 and the storage node 106. In some embodiments, the doped well 302 may extend beneath at least a portion of the first isolation structure 114. In further embodiments, the doped well 302 may be disposed directly between a portion of the first vertical transfer gate 116c and the storage node 106 and/or a portion of the second vertical transfer gate 116d and the storage node 106. In other embodiments, the doped well 302 may be spaced a lateral distance from the first vertical transfer gate 116c and/or the second vertical transfer gate 116d. In yet further embodiments, the doped well 302 may be spaced from the storage node 106.

A doped isolation region 303 is disposed in the first semiconductor substrate 102. The doped isolation region 303 is a region of the first semiconductor substrate having the second doping type. In some embodiments, the doped isolation region 303 is spaced from the storage node 106, the floating diffusion node 108, and the second doped region 112. The doped isolation region 303 may be spaced from the first isolation structure 114. The doped isolation region 303 may be disposed directly between the second gate 116b and the storage node 106, directly between the second doped region 112 and the storage node 106, and/or directly between the floating diffusion node 108 and the storage node 106.

In some embodiments, the doped isolation region 303 may extend beneath at least a portion of the first isolation structure 114. In further embodiments, the doped isolation region 303 may be disposed directly between a portion of the first vertical transfer gate 116c and the storage node 106 and/or a portion of the second vertical transfer gate 116d and the storage node 106. In other embodiments, the doped isolation region 303 may be spaced a lateral distance from the first vertical transfer gate 116c and/or the second vertical transfer gate 116d.

In some embodiments, the doped isolation region 303 has a higher doping concentration of the second doping type dopants than the doped well 302. The doped isolation region 303 may have a doping concentration of second doping type dopants between about $5 \times 10^{15}$ cm$^{-3}$ and about $5 \times 10^{18}$ cm$^{-3}$. Because the doped well 302 has a doping concentration of second doping type dopants between about $5\times10^{15}$ cm$^3$ and about $5\times10^{18}$ cm$^3$, the doped isolation region 303 may improve QE, AR, and/or SE of the BSIGS image sensor 100 by improving electrical isolation (e.g., via p-n junction isolation) between the storage node 106 and the floating diffusion node 108 and/or the second doped region 112.

Also shown in FIG. 3, an integrated chip (IC) 304 is disposed over the first semiconductor substrate 102, the first ILD structure 122, and the first interconnect structure 124. The IC 304 comprises a third semiconductor substrate 306. The third semiconductor substrate 306 may comprise any type of semiconductor body (e.g., monocrystalline silicon/CMOS bulk, SiGe, SOI, etc.). A plurality of semiconductor devices 308a-b (e.g., p-channel MOSFETs, n-channel MOSFETs, etc.) are disposed on the third semiconductor substrate 306. In some embodiments, the semiconductor devices 308a-b are image processing devices configured to process signals output by the storage node 106.

A fourth ILD structure 310 is disposed between the third semiconductor substrate 306 and the first ILD structure 122. In some embodiments, the fourth ILD structure 310 comprises one or more stacked ILD layers, which may respectively comprise a low-k dielectric (e.g., a dielectric material with a dielectric constant less than about 3.9), an oxide (e.g., silicon dioxide (SiO$_2$)), or the like. A second interconnect structure 312 (e.g., copper interconnect) is disposed in the fourth ILD structure 310. The second interconnect structure 312 comprises a plurality of conductive features (e.g., metal lines, metal vias, metal contacts, bond pads, etc.). In further embodiments, the plurality of conductive features may comprise, for example, Cu, Al, W, Au, some other conductive material, or a combination of the foregoing. It will be appreciated that, in some embodiments, one or more conductive features (e.g., through-substrate vias) may be disposed in the third semiconductor substrate 306, thereby providing an electrical connection between the second interconnect structure 312 and one or more I/O structures.

The fourth ILD structure 310 is bonded to the third ILD structure 210. The first interconnect structure 124 may comprise a plurality of first conductive bond pads 124d. The second interconnect structure 312 may comprise a plurality of second conductive bond pads 312a. In some embodiments, the first conductive bond pads 124d are bonded to the second conductive bond pads 312a, respectively. In further embodiments, the first conductive bond pads 124d are electrically coupled to the second conductive bond pads 312a, respectively, thereby providing electrical connections between features disposed on the first semiconductor substrate (e.g., AB gates, vertical transfer gates, reset gates, source-follower gates, source/drain regions, floating diffusion nodes, etc.) to the plurality of semiconductor devices 308a-b disposed on the third semiconductor substrate 306.

Figure 4:
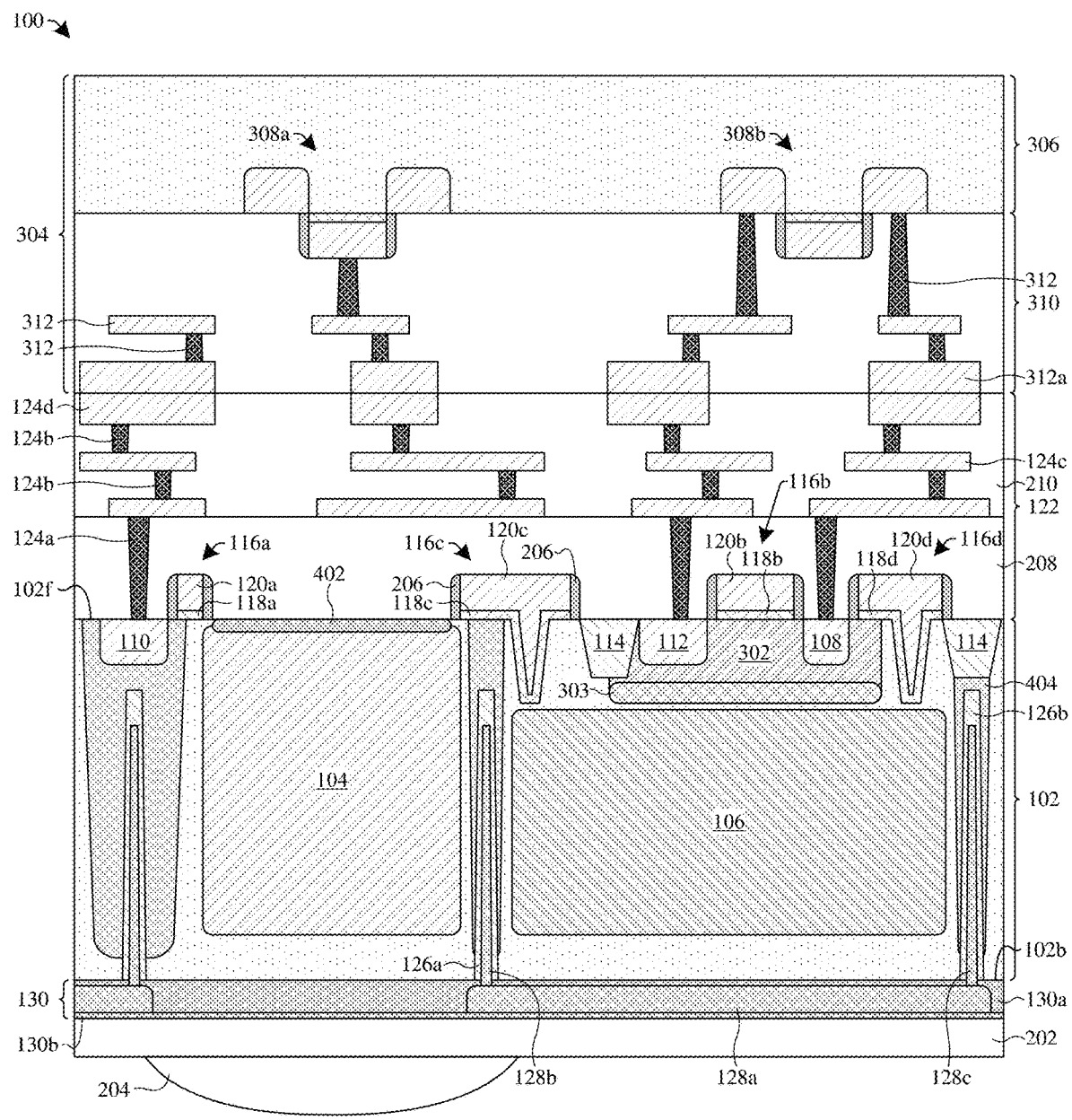
FIG. 4 illustrates a cross-sectional view of some other embodiments of the BSIGS image sensor of FIG. 1.

FIG. 4 illustrates a cross-sectional view of some other embodiments of the BSIGS image sensor 100 of FIG. 1.

As shown in FIG. 4, a third doped region 402 is disposed in the first semiconductor substrate 102. The third doped region is a region of the first semiconductor substrate 102 having the second doping type. The third doped region 402 is disposed between the photodetector 104 and the front side 102f of the first semiconductor substrate 102.

A plurality of fourth doped regions 404 are disposed in the first semiconductor substrate 102. For ease of illustration, only one of the fourth doped regions 404 are labeled. The fourth doped regions 404 are regions of the first semiconductor substrate 102 having the second doping type. The fourth doped regions 404 may extend into the first semiconductor substrate 102 from the front side 102f of the first semiconductor substrate 102. A first one of the fourth doped regions 404 may extend into the first semiconductor substrate 102 between the photodetector 104 and the storage node 106. A second one of the fourth doped regions 404 may extend into the first semiconductor substrate 102 on an opposite side of the photodetector 104 as the first one of the fourth doped regions 404. A third one of the fourth doped regions 404 may extend into the first semiconductor substrate 102 on an opposite side of the storage node 106 as the first one of the fourth doped regions 404. In some embodiments, the third one of the fourth doped regions 404 is disposed directly beneath a portion of the first isolation structure 114. In further embodiments, the first doped region 110 may be disposed in the second one of the fourth doped regions 404.

In some embodiments, bottom sides of the fourth doped regions 404 are disposed between the back side 102b of the first semiconductor substrate 102 and both the storage node 106 and the photodetector 104. In further embodiments, the fourth doped regions 404 are spaced from the back side 102b of the first semiconductor substrate 102. The fourth doped regions 404 may have varying widths. For example, the first one of the fourth doped regions 404 may have a third width, and the second one (and/or the third one) of the fourth doped regions 404 may have a fourth width different than the third width. In yet further embodiments, the second isolation structure 126 is at least partially disposed in the fourth doped regions 404.

The doped isolation region 303 may be disposed between the second portion of the reflective structure 128b and the third portion of the reflective structure 128c. In some embodiments, a bottom side of the doped isolation region 303 may be disposed between the front side 102f of the first semiconductor substrate 102 and an uppermost surface of the second portion of the reflective structure 128b and/or an uppermost surface of the third portion of the reflective structure 128c. In other embodiments, the uppermost surface of the second portion of the reflective structure 128b and/or the uppermost surface of the third portion of the reflective structure 128c is disposed between an upper side of the doped isolation region 303 and a bottom side of the doped isolation region 303. In yet other embodiments, the uppermost surface of the second portion of the reflective structure 128b and/or the uppermost surface of the third portion of the reflective structure 128c is disposed between the front side 102f of the first semiconductor substrate 102 and the upper side of the doped isolation region 303. In further embodiments, a portion of the first vertical transfer gate 116c is disposed between the first portion of the second isolation structure 126a and the doped isolation region 303. In yet further embodiments, a portion of the second vertical transfer gate 116d is disposed between the second portion of the second isolation structure 126b and the doped isolation region 303.

In some embodiments, the dielectric structure 130 may comprise a first dielectric layer 130a and a second dielectric layer 130b. The first dielectric layer 130a is disposed between the second dielectric layer 130b and the first semiconductor substrate 102. The first dielectric layer 130a may have a substantially planar bottom surface. The first portion of the reflective structure 128a may be embedded in the first dielectric layer 130a. In further embodiments, the first portion of the reflective structure 128a has a substantially planar bottom surface that is co-planar with the bottom surface of the first dielectric layer 130a. In yet further embodiments, the first dielectric layer 130a may comprise, for example, an oxide (e.g., SiO$_2$), a nitride (e.g., SiN), an oxy-nitride (e.g., SiO$_X$N$_Y$), a high-k dielectric (e.g., HfO$_2$, ZrO$_2$, or some other dielectric material with a dielectric constant greater than about 3.9), some other dielectric material, or a combination of the foregoing.

The second dielectric layer 130b separates the first portion of the reflective structure 128a from the light filter 202. The second dielectric layer 130b may have a substantially planar bottom surface. In some embodiments, the second dielectric layer 130b may comprise, for example, an oxide (e.g., SiO$_2$), a nitride (e.g., SiN), an oxy-nitride (e.g., SiO$_X$N$_Y$), a high-k dielectric (e.g., HfO$_2$, ZrO$_2$, or some other dielectric material with a dielectric constant greater than about 3.9), some other dielectric material, or a combination of the foregoing. In further embodiments, the second dielectric layer 130b may contact the bottom surface of the first dielectric layer 130a and the bottom surface of the first portion of the reflective structure 128a. In yet further embodiments, the first dielectric layer 130a and the second dielectric layer 130b may comprise a same dielectric material. In other embodiments, the first dielectric layer 130a and the second dielectric layer 130b may comprise a different dielectric material.

FIGS. 5-20 illustrate a series of cross-sectional views of some embodiments for forming the BSIGS image sensor 100 of FIG. 4.

Figure 5:
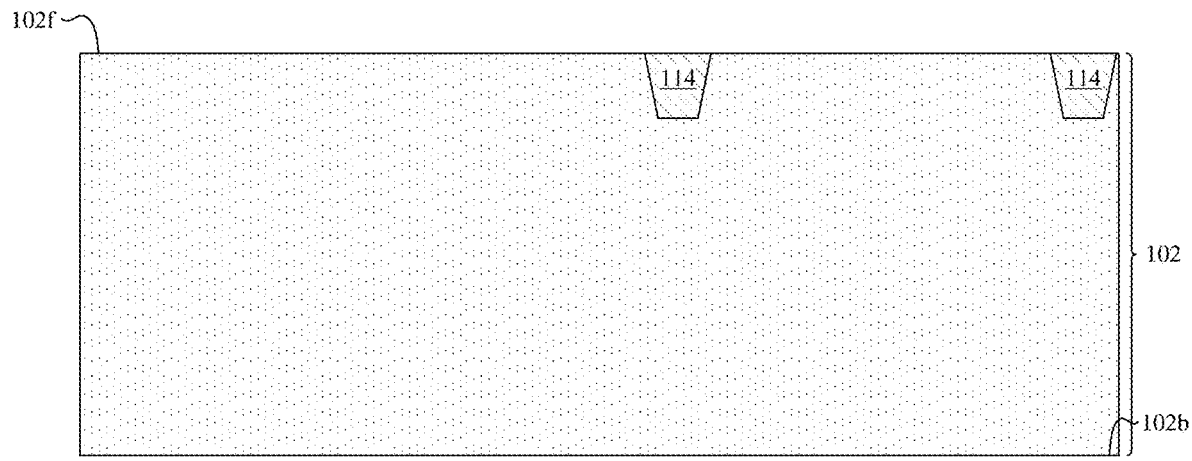
FIGS. 5-20 illustrate a series of cross-sectional views of some embodiments for forming the BSIGS image sensor of FIG. 4.

As shown in FIG. 5, a first isolation structure 114 is formed in a first semiconductor substrate 102. In some embodiments, the first isolation structure 114 may be formed by selectively etching the first semiconductor substrate 102 to form a trench in the first semiconductor substrate 102, and subsequently filing the trench with a dielectric material. In further embodiments, the first semiconductor substrate 102 is selectively etched by forming a masking layer (e.g., positive/negative photoresist) (not shown) on a front side 102f of the first semiconductor substrate 102, and subsequently exposing the first semiconductor substrate 102 to an etchant (e.g., wet/dry etchant) to remove unmasked portions of the first semiconductor substrate 102. Subsequently, in some embodiments, the masking layer is stripped away. In yet further embodiments, the dielectric material may comprise an oxide (e.g., SiO$_2$), a nitride (e.g., SiN), an oxy-nitride (e.g., SiO$_X$N$_Y$), a carbide (e.g., SiC), or the like. It will be appreciated that, in some embodiments, the first semiconductor substrate 102 may be doped (e.g., via ion implantation) with a second doping type (e.g., p-type/n-type) before forming the first isolation structure 114.

Figure 6:
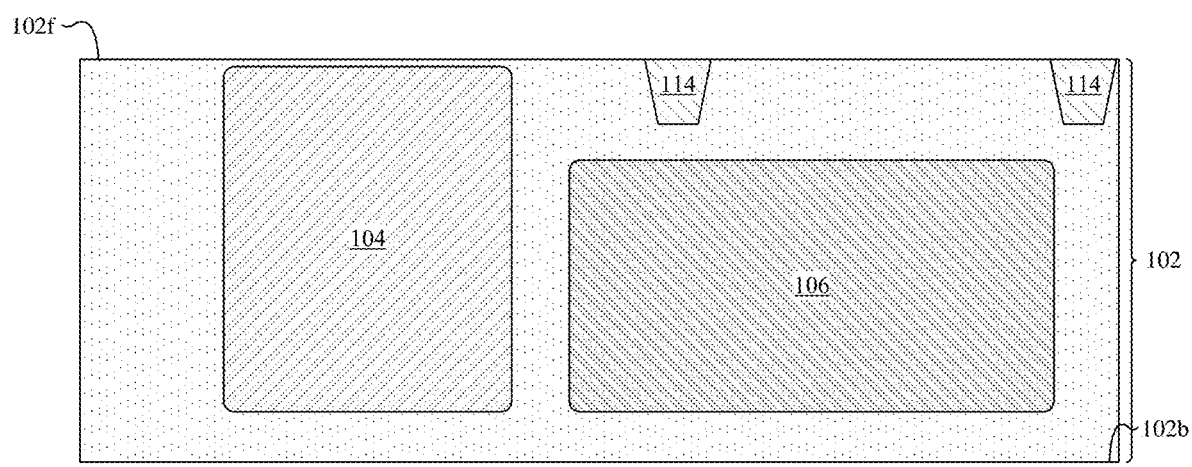

As shown in FIG. 6, a photodetector 104 is formed in the first semiconductor substrate 102. The photodetector 104 comprises a region of the first semiconductor substrate 102 having a first doping type (e.g., n-type/p-type) opposite the second doping type. In some embodiments, the photodetector 104 may be formed by a first implantation process (e.g., via ion implantation) that utilizes a first masking layer (not shown) on the front side 102f of the first semiconductor substrate 102 to selectively implant first doping type dopants (e.g., n-type dopants) into the first semiconductor substrate 102. Subsequently, in some embodiments, the first masking layer is stripped away.

Also shown in FIG. 6, a storage node 106 is formed in the first semiconductor substrate 102. The storage node 106 is a region of the first semiconductor substrate 102 having the first doping type. In some embodiments, the storage node 106 is formed buried deeper (e.g., spaced further away from the front side 1020 in the first semiconductor substrate 102 than the photodetector 104. In further embodiments, the storage node 106 may be formed by a second implantation process that utilizes a second masking layer (not shown) on the front side 102f of the first semiconductor substrate 102 to selectively implant first doping type dopants into the first semiconductor substrate 102. Subsequently, in some embodiments, the second masking layer is stripped away. In further embodiments, the storage node 106 and the photodetector 104 may be formed by a same selective implant process (e.g., utilizing a same masking layer and/or same ion implantation process).

Figure 7:
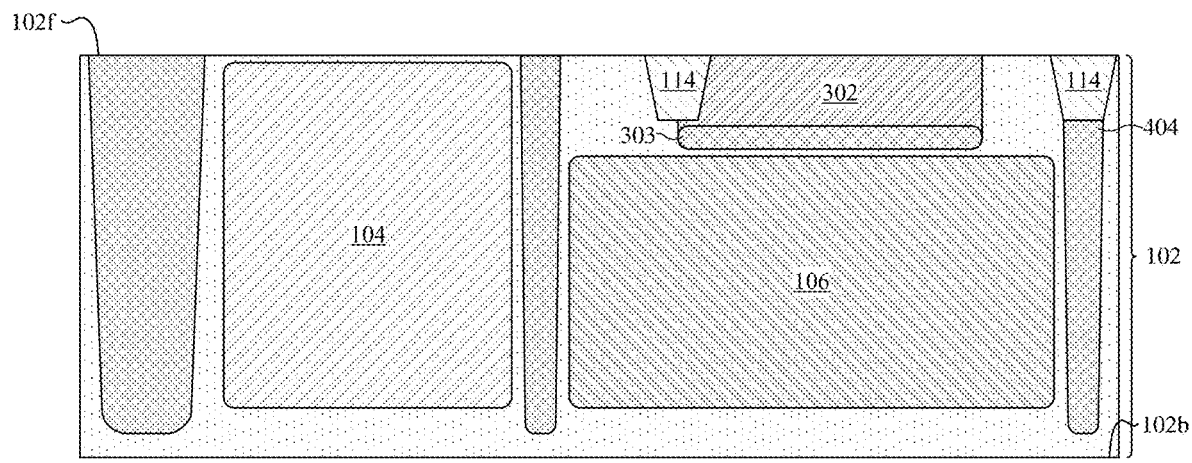

As shown in FIG. 7, a doped well 302 is formed in the first semiconductor substrate 102. The doped well 302 is a region of the first semiconductor substrate 102 having the second doping type. In some embodiments, the doped well 302 is formed directly over the storage node 106. In further embodiments, the doped well 302 may be formed by a first implantation process that utilizes a first masking layer (not shown) on the front side 102f of the first semiconductor substrate 102 to selectively implant second doping type dopants (e.g., p-type dopants) into the first semiconductor substrate 102. Subsequently, in some embodiments, the first masking layer is stripped away.

Also shown in FIG. 7, a doped isolation region 303 is formed in the first semiconductor substrate 102. The doped isolation region 303 is a region of the first semiconductor having the second doping type. In some embodiments, the doped isolation region 303 has a higher doping concentration of second doping type dopants than the doped well 302. In further embodiments, the doped isolation region 303 may be formed in the doped well 302. It will be appreciated that the doped isolation region 303 may be formed before or after the doped well 302 is formed.

In some embodiments, a process for forming the doped isolation region 303 comprises forming a second masking layer on the front side 102f of the first semiconductor substrate 102. Thereafter, a second implantation process is performed with the second masking layer in place to implant second doping type dopants into unmasked portions of the first semiconductor substrate 102, thereby forming the doped isolation region 303. Subsequently, in some embodiments, the second masking layer is stripped away.

In some embodiments, the second impanation process implants second doping type dopants in the first semiconductor substrate 102 so that the doped isolation region 303 has a doping concentration of second doping type dopants between about $5 \times 10^{15}$ cm$^{-3}$ and about $5 \times 10^{18}$ cm$^{-3}$. It will be appreciated that, in some embodiments, rather than forming a second masking layer, the first masking layer may be utilized to mask the first semiconductor substrate 102 during the second implantation process. In other embodiments, the second masking layer may be formed on the first masking layer and the first semiconductor substrate 102, and both the first masking layer and the second masking layer may be stripped away after the second implantation process.

Also shown in FIG. 7, a plurality of fourth doped regions 404 are formed in the first semiconductor substrate 102. The fourth doped regions 404 are regions of the first semiconductor substrate 102 having the second doping type. In some embodiments, the fourth doped regions 404 may be formed by a third implantation process that utilizes a third masking layer (not shown) on the front side 102f of the first semiconductor substrate 102 to selectively implant second doping type dopants into the first semiconductor substrate 102. Subsequently, in some embodiments, the third masking layer is stripped away. It will be appreciated that the fourth doped regions 404 may be formed before or after the doped well 302 is formed, or may be formed before or after the doped isolation region 303 is formed.

Figure 8:
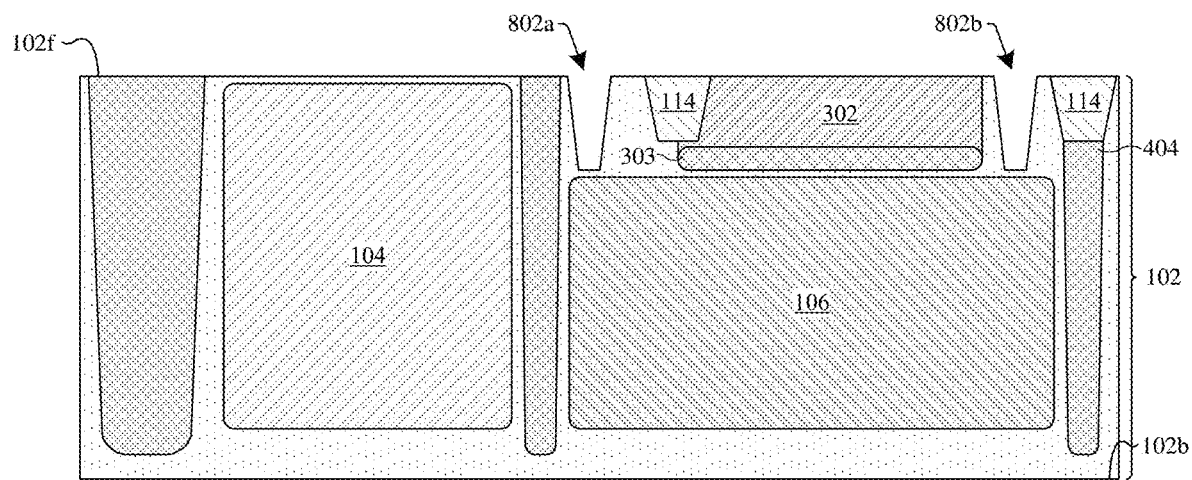

As shown in FIG. 8, a plurality of openings 802a-b are formed in the first semiconductor substrate 102. For example, a first opening 802a and a second opening 802b are formed spaced apart in the first semiconductor substrate 102. The first opening 802a and the second opening 802b may be formed on opposite sides of the doped isolation region 303. The openings 802a-b are formed extending into the first semiconductor substrate 102 from the front side 102f of the first semiconductor substrate 102. In some embodiments, the openings 802a-b are formed with angled sidewalls. The openings 802a-b may be formed with bottom surfaces disposed between the storage node 106 and a bottom surface of the first isolation structure 114. In further embodiments, a process for forming the openings 802a-b comprises forming a masking layer (not shown) on the front side 102f of the first semiconductor substrate 102. Thereafter, the first semiconductor substrate 102 is exposed to an etchant to remove unmasked portions of the first semiconductor substrate 102, thereby forming the openings 802a-b. Subsequently, in some embodiments, the masking layer is stripped away.

Figure 9:
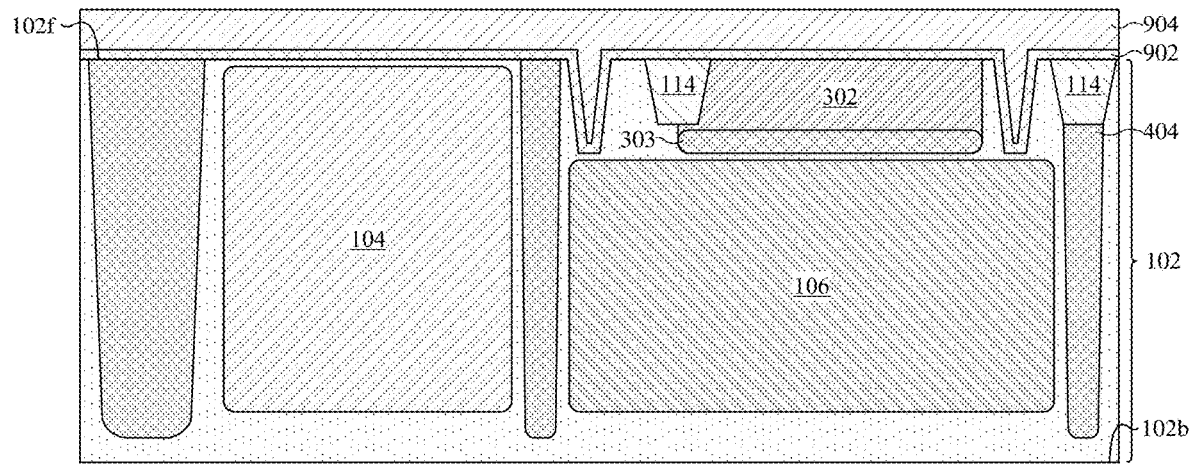

As shown in FIG. 9, a gate dielectric layer 902 is formed on the front side 102f of the first semiconductor substrate 102 and lining the openings 802a-b. In some embodiments, a process for forming the gate dielectric layer 902 comprises depositing or growing the gate dielectric layer 902 on the first semiconductor substrate 102. The gate dielectric layer 902 may be deposited or grown by, for example, chemical vapor deposition (CVD), physical vapor deposition (PVD), atomic layer deposition (ALD), thermal oxidation, sputtering, some other deposition or growth process, or a combination of the foregoing. In further embodiments, the gate dielectric layer 902 may comprise, for example, an oxide (e.g., $SiO_2$), a high-k dielectric material (e.g., $HfO_2$, $ZrO_2$, or some other dielectric material with a dielectric constant greater than about 3.9), or the like.

Also shown in FIG. 9, a gate electrode layer 904 is formed on the gate dielectric layer 902. In some embodiments, a process for forming the gate electrode layer 904 comprises depositing the gate electrode layer 904 on the gate dielectric layer 902. The gate electrode layer 904 may be deposited by, for example, CVD, PVD, ALD, sputtering, electrochemical plating, electroless plating, some other deposition process, or a combination of the foregoing. In further embodiments, the gate electrode layer 904 may comprise, for example, polysilicon (e.g., doped/undoped polysilicon), a metal (e.g., W, Al, Ti, Mo, or the like), or the like.

Figure 10:
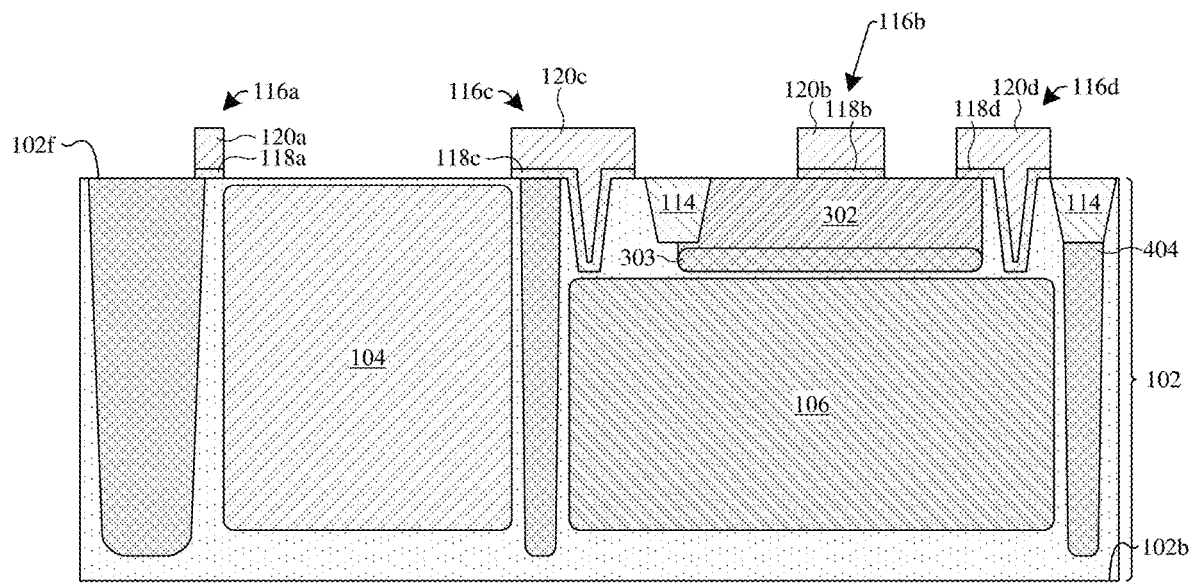

As shown in FIG. 10, a plurality of gates 116 are formed on the front side 102f of the first semiconductor substrate 102. For example, a first gate 116a, a second gate 116b, a first vertical transfer gate 116c, and a second vertical transfer gate 116d are formed spaced apart on/in the first semiconductor substrate 102. In some embodiments, a process for forming the plurality of gates 116 comprises forming a masking layer (not shown) on the gate electrode layer 904 (see, e.g., FIG. 9). Thereafter, the gate electrode layer 904 and the gate dielectric layer 902 are exposed to an etchant. The etchant removes unmasked portions of the gate electrode layer 904, thereby forming a plurality of gate electrodes 120 on the gate dielectric layer 902, and unmasked portions of the gate dielectric layer 902, thereby forming a plurality of gate dielectrics 118. Subsequently, the masking layer may be stripped away. It will be appreciated that one or more etchants and/or masking layers may be utilized to form the plurality of gates 116.

Figure 11:
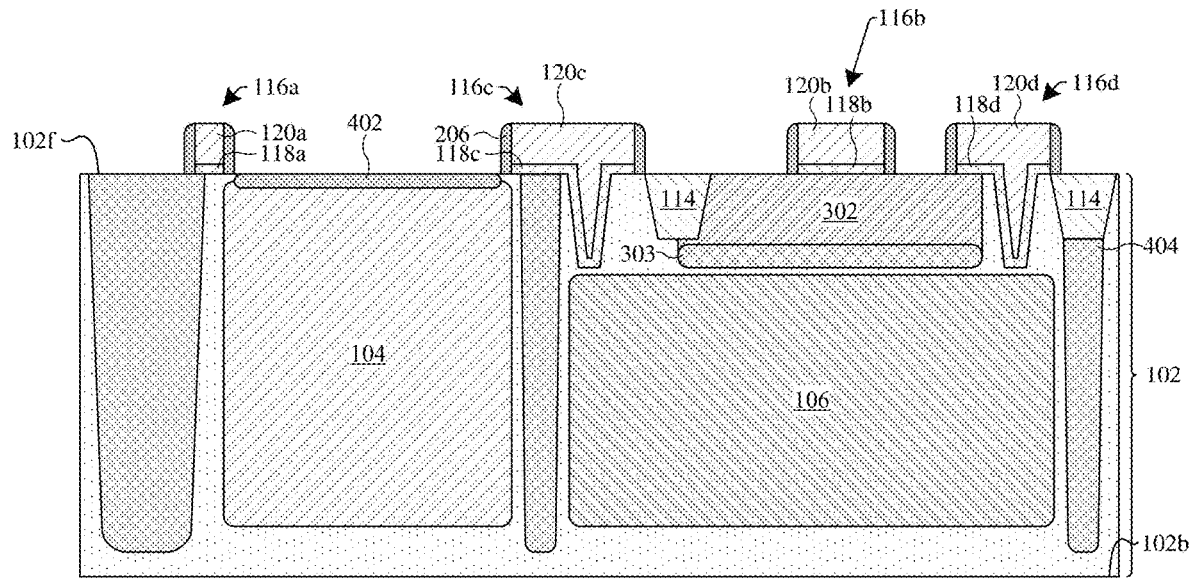

As shown in FIG. 11, a plurality of sidewall spacers 206 are formed over the first semiconductor substrate 102 and along sidewalls of the plurality of gates 116. In some embodiments, the sidewall spacers 206 may be formed by depositing a spacer layer (not shown) over the first semiconductor substrate 102 and over the plurality of gates 116. In further embodiments, the spacer layer may be deposited by PVD, CVD, ALD, sputtering, or the like. The spacer layer is subsequently etched to remove the spacer layer from horizontal surfaces, leaving the spacer layer along opposing sides of the plurality of gates 116, as the sidewall spacers 206. In various embodiments, the spacer layer may comprise, for example, a nitride (e.g., SiN), an oxy-nitride (e.g., SiOxNy), or the like. It will be appreciated that, in some embodiments, lightly-doped source/drain regions may be formed in the first semiconductor substrate 102 prior to forming the sidewall spacers 206.

Also shown in FIG. 11, a third doped region 402 is formed in the first semiconductor substrate 102. In some embodiments, the third doped region 402 has the second doping type. In further embodiments, the third doped region 402 may be formed at least partial in the photodetector 104. In yet further embodiments, a process for forming the third doped region 402 comprises forming a masking layer (not shown) on the front side 102f of the first semiconductor substrate 102 and over the plurality of gates 116. Thereafter, with the masking layer in place, an implantation process is performed to selectively implant second doping type dopants into the first semiconductor substrate 102. Subsequently, in some embodiments, the masking layer is stripped away.

Figure 12:
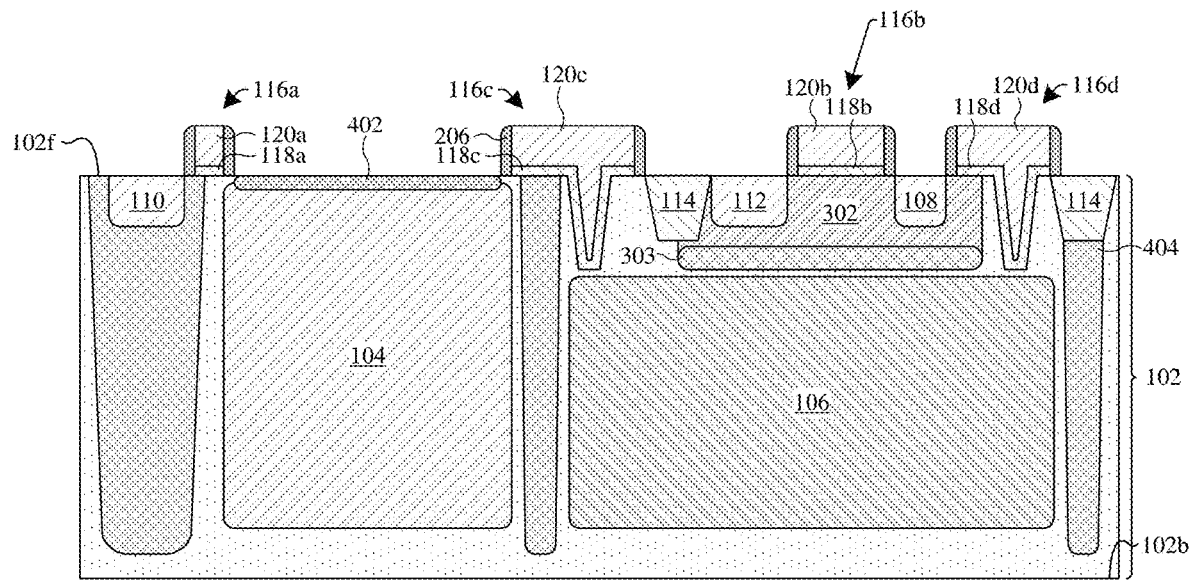

As shown in FIG. 12, a floating diffusion node 108, a first doped region 110, and a second doped region 112 are formed in the first semiconductor substrate 102. The floating diffusion node 108 is a region of the first semiconductor substrate 102 having the first doping type. In some embodiments, the first doped region 110 has the first doping type. In further embodiments, the second doped region 112 has the first doping type. The floating diffusion node 108 and the second doped region 112 may be formed in the doped well 302. In further embodiments, the floating diffusion node 108 and the second doped region 112 are formed between the first vertical transfer gate 116c and the second vertical transfer gate 116d. In yet further embodiments, the first doped region 110 may be formed in one of the fourth doped regions 404.

In some embodiments, a process for forming the floating diffusion node 108, the first doped region 110, and the second doped region 112 comprises forming a masking layer (not shown) on the front side 102f of the first semiconductor substrate 102 and covering the plurality of gates 116. Thereafter, with the masking layer in place, an implantation process is performed to selectively implant first doping type dopants into the first semiconductor substrate 102. It will be appreciated that, in some embodiments, multiple implantation processes are performed to form the floating diffusion node 108, the first doped region 110, and the second doped region 112.

Figure 13:
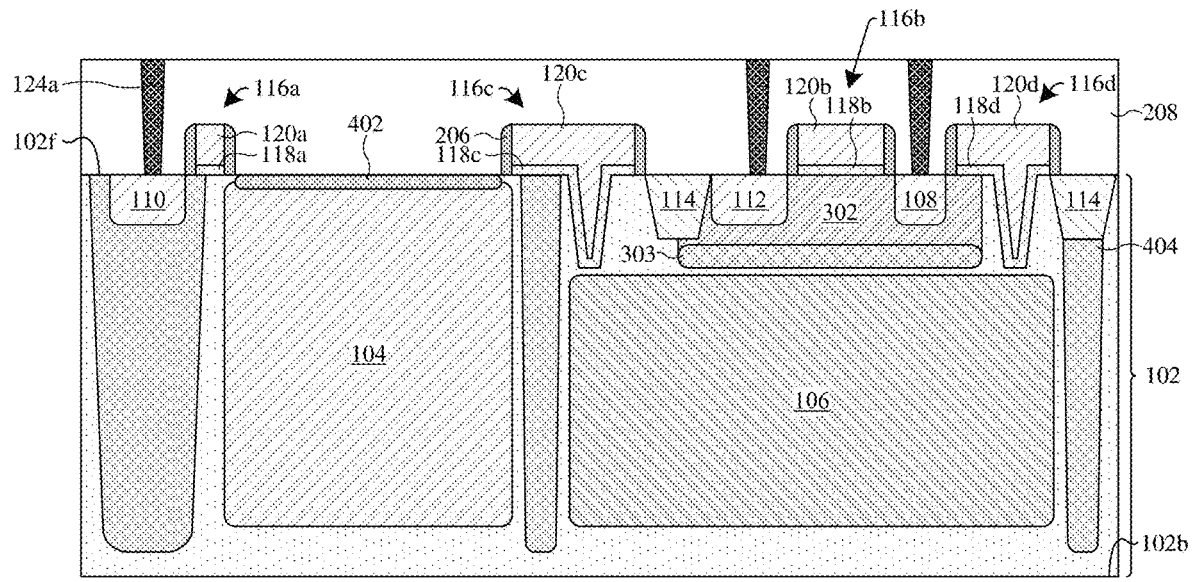

As shown in FIG. 13, a second ILD structure 208 is formed over the front side 102f of the first semiconductor substrate 102 and over the plurality of gates 116. In some embodiments, the second ILD structure 208 may be formed with a substantially planar upper surface. In further embodiments, a process for forming the second ILD structure 208 comprises depositing an ILD layer on the first semiconductor substrate 102 and covering the plurality of gates 116. The ILD layer may be deposited by CVD, PVD, sputtering, or some other deposition process. Thereafter, a planarization process (e.g., chemical-mechanical polishing (CMP)) may be performed on the ILD layer.

Also shown in FIG. 13, a plurality of conductive contacts 124a are formed extending through the second ILD structure 208. The conductive contacts 124a may be formed extending to the plurality of gate electrodes 120 and/or the first semiconductor substrate 102 (e.g., the floating diffusion node 108, the first doped region 110, the second doped region 112, etc.). In some embodiments, a process for forming the conductive contacts 124a comprises forming a plurality of conductive contact openings in the second ILD structure 208 that extend to the plurality of gates 116 and/or the first semiconductor substrate 102. The conductive contact openings may be formed by a selective etching process that utilizes a masking layer (not shown) on the second ILD structure 208 to selectively expose the second ILD structure 208 to an etchant that removes unmasked portions of the second ILD structure 208. Subsequently, in some embodiments, the masking layer is stripped away.

Thereafter, a conductive material (e.g., W) is deposited on the second ILD structure 208 and filling the conductive contact openings. Subsequently, a planarization process (e.g., CMP) is performed into the conductive material, thereby forming the conductive contacts 124a. In some embodiments, the conductive material may be deposited by CVD, PVD, ALD, sputtering, electrochemical plating, electroless plating, some other deposition process, or a combination of the foregoing.

Figure 14:
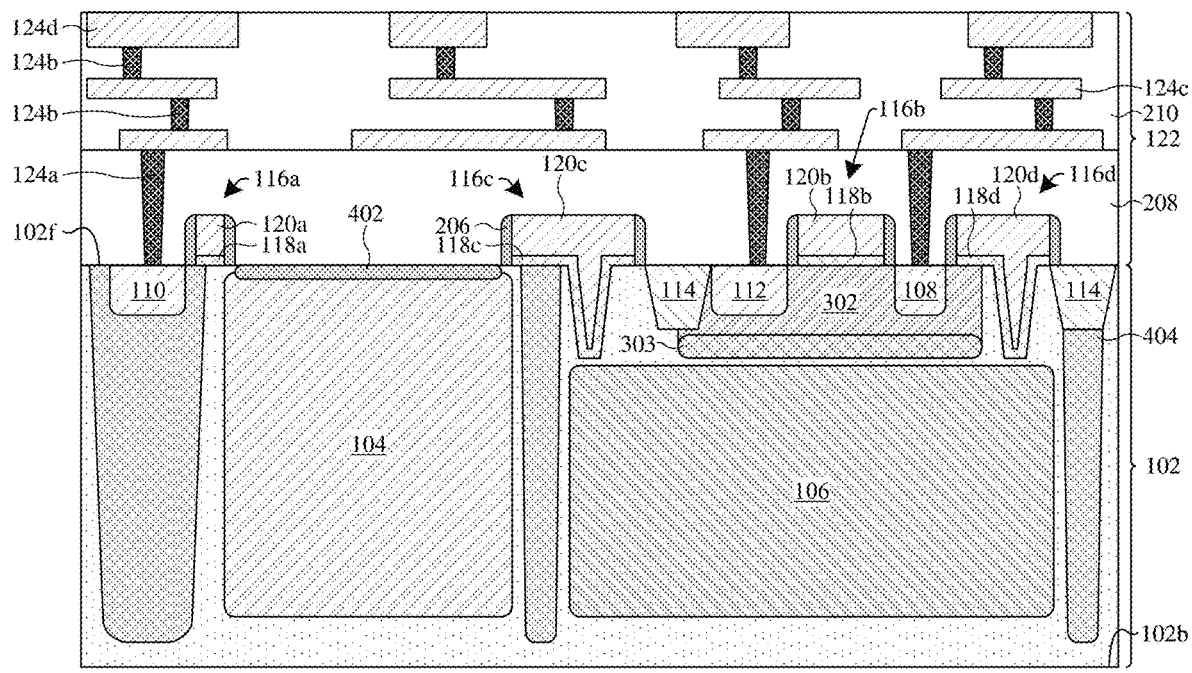

As shown in FIG. 14, a third ILD structure 210, a plurality of conductive vias 124b, a plurality of conductive wires 124c, and a plurality of first conductive bond pads 124d are formed over the second ILD structure 208 and the conductive contacts 124a. The third ILD structure 210 may be formed with a substantially planar upper surface. In some embodiments, a process for forming the third ILD structure 210 comprises depositing a plurality of ILD layers, which are stacked on one another, over the second ILD structure 208 and the conductive contacts 124a. The ILD layers may be deposited by CVD, PVD, ALD, sputtering, some other deposition process, or a combination of the foregoing. In further embodiments, a planarization process (e.g., CMP) may be performed on one or more of the plurality of ILD layers.

In some embodiments, a process for forming the conductive wires 124c, the conductive vias 124b, and the first conductive bond pads 124d comprises forming a first ILD layer over the second ILD structure 208 and the conductive contacts 124a. The first ILD layer is selectively etched to form a first set of conductive wire openings (not shown) that correspond to a first set of the conductive wires 124c. A conductive material (e.g., Cu) is deposited on the first ILD layer and in the first set of conductive line openings. A planarization process (e.g., CMP) is performed into the conductive material, thereby forming the first set of the conductive wires 124c.

Thereafter, a second ILD layer is formed over the first set of conductive wires and the first ILD layer. The second ILD layer is selectively etched to form a first set of conductive via openings (not shown) that correspond to a first set of the conductive vias 124b. A conductive material (e.g., Cu) is deposited on the second ILD layer and in the first set of conductive via openings. A planarization process (e.g., CMP) is performed into the conductive material, thereby forming the first set of the conductive vias 124b. This process (e.g., alternating formation of conductive wires and vias) is repeated until the conductive wires 124c and the conductive vias 124b are formed. It will be appreciated that, in some embodiments, the conductive wires 124c and the conductive vias 124b may be formed by one or more dual damascene processes.

Thereafter, a third ILD layer is formed over the conductive wires 124c, the first ILD layer, the conductive vias 124b, and the second ILD layer. The third ILD layer is selectively etched to form a plurality of bond pad openings (not shown) in the third ILD layer. A conductive material (e.g., Cu, Au, etc.) is deposited on the third ILD layer and into the bond pad openings. A planarization process (e.g., CMP) is performed into the conductive material, thereby forming the first conductive bond pads 124d. In yet further embodiments, after the first conductive bond pads 124d are formed, formation of a first ILD structure 122 is complete.

Figure 15:
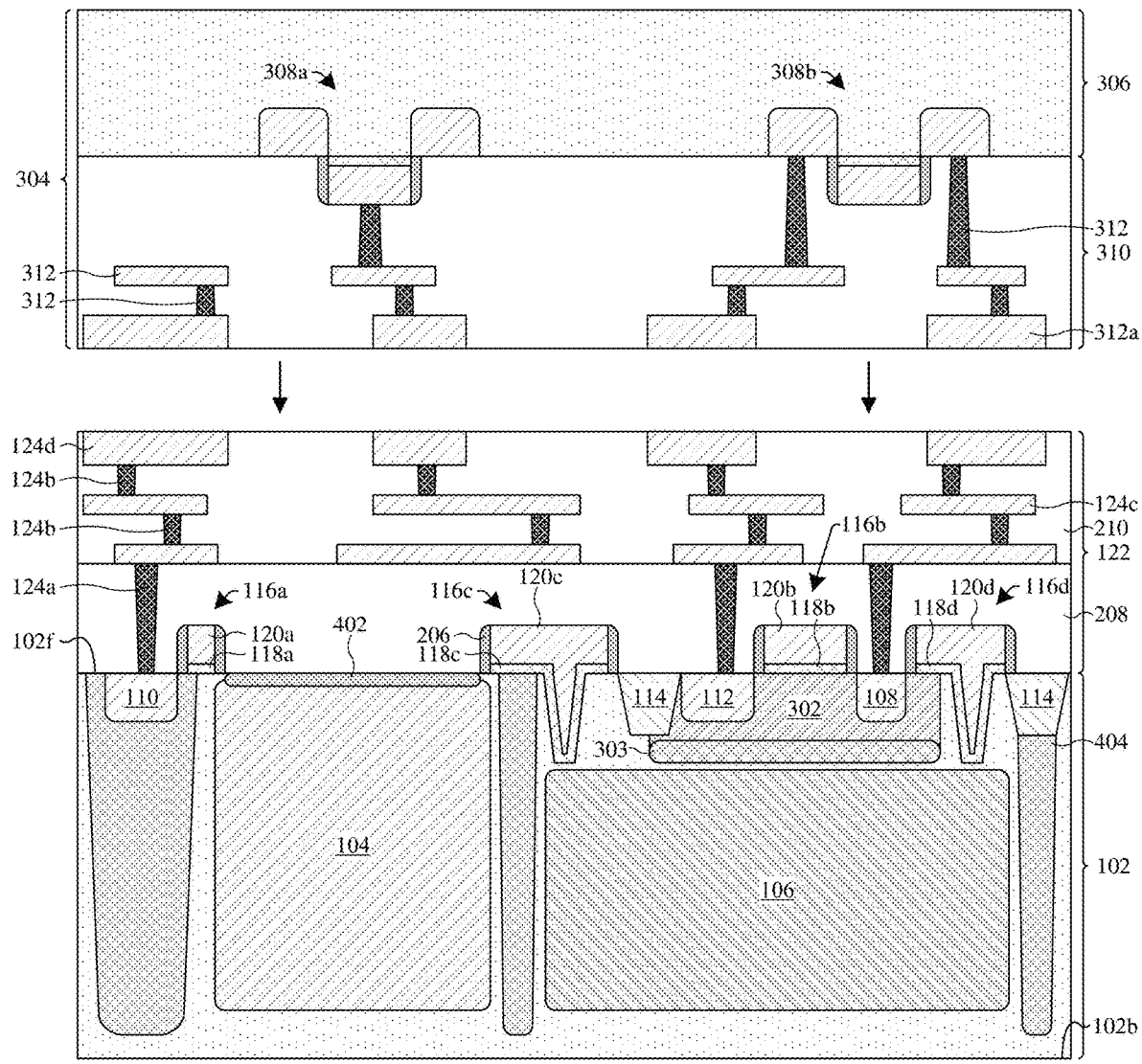

As shown in FIG. 15, an integrated chip (IC) 304 is bonded to the first semiconductor substrate 102. In some embodiments, the IC 304 comprises a third semiconductor substrate 306; a plurality of semiconductor devices 308a-b; a fourth ILD structure 310; and a second interconnect structure 312, which comprises a plurality of second conductive bond pads 312a. In further embodiments, a process for bonding the IC 304 to the first semiconductor substrate 102 comprises positioning the IC 304 so that the second conductive bond pads 312a are substantially aligned with and face the first conductive bond pads 124d, respectively. Thereafter, the second conductive bond pads 312a are bonded to the first conductive bond pads 124d, respectively (e.g., via a hybrid bonding process, a direct bonding process, etc.). It will be appreciated that, in some embodiments, the fourth ILD structure 310 is bonded to the third ILD structure 210.

Figure 16:
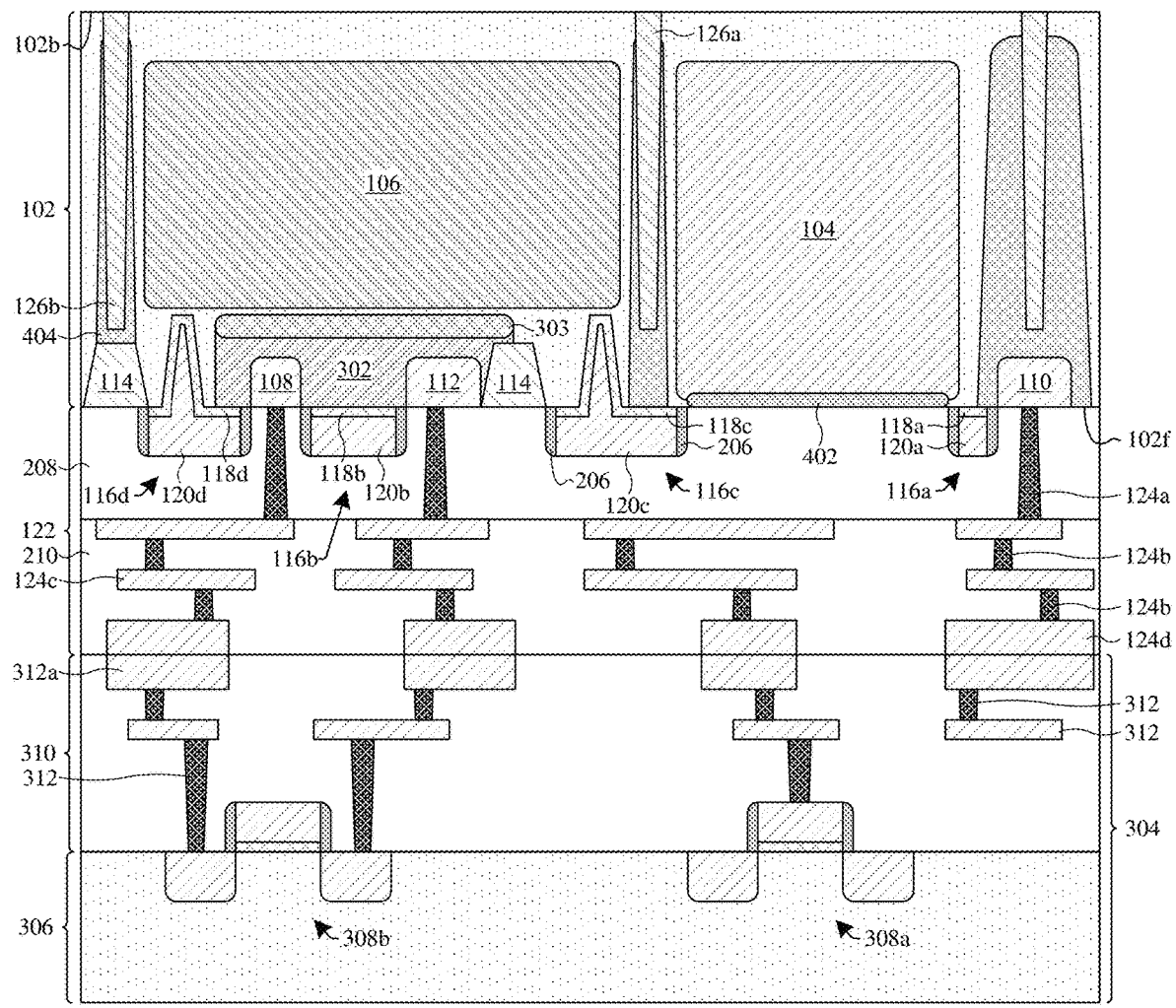

As shown in FIG. 16, a second isolation structure 126 is formed in the first semiconductor substrate 102. The second isolation structure 126 is formed extending into the first semiconductor substrate 102 from the back side 102b of the first semiconductor substrate 102. A first portion of the second isolation structure 126a may be formed extending into the first semiconductor substrate 102 and between the storage node 106 and the photodetector 104. A second portion of the second isolation structure 126b may be formed extending into the first semiconductor substrate 102 and on an opposite side of the storage node 106 as the first portion of the second isolation structure 126a. In some embodiments, the first portion of the second isolation structure 126a may be formed in one of the fourth doped regions 404, and the second portion of the second isolation structure 126b may be formed in another one of the fourth doped regions 404.

In some embodiments, a process for forming the second isolation structure 126 comprises selectively etching the first semiconductor substrate 102 to form an isolation structure opening in the first semiconductor substrate 102 that extends into the first semiconductor substrate 102 from the back side 102b of the first semiconductor substrate 102. Thereafter, the isolation structure opening is filled with a dielectric material (e.g., via CVD, PVD, ALD, thermal oxidation, sputtering, etc.). In further embodiments, the first semiconductor substrate 102 is selectively etched by forming a masking layer (not shown) on the back side 102b of the first semiconductor substrate 102, and subsequently exposing the first semiconductor substrate 102 to an etchant configured to remove unmasked portions of the first semiconductor substrate 102. In further embodiments, the dielectric material may comprise an oxide (e.g., $SiO_2$), a nitride (e.g., (SiN), an oxynitride (e.g., $SiO_xN_y$), a carbide (e.g., SiC), or the like. In yet further embodiments, a planarization process (e.g., CMP) may be performed into the dielectric material and the first semiconductor substrate 102 to form a substantially planar surface. It will be appreciated that, in some embodiments, the first semiconductor substrate 102 may be thinned (e.g., via grinding, CMP, or the like) before (or after) the second isolation structure 126 is formed.

Figure 17:
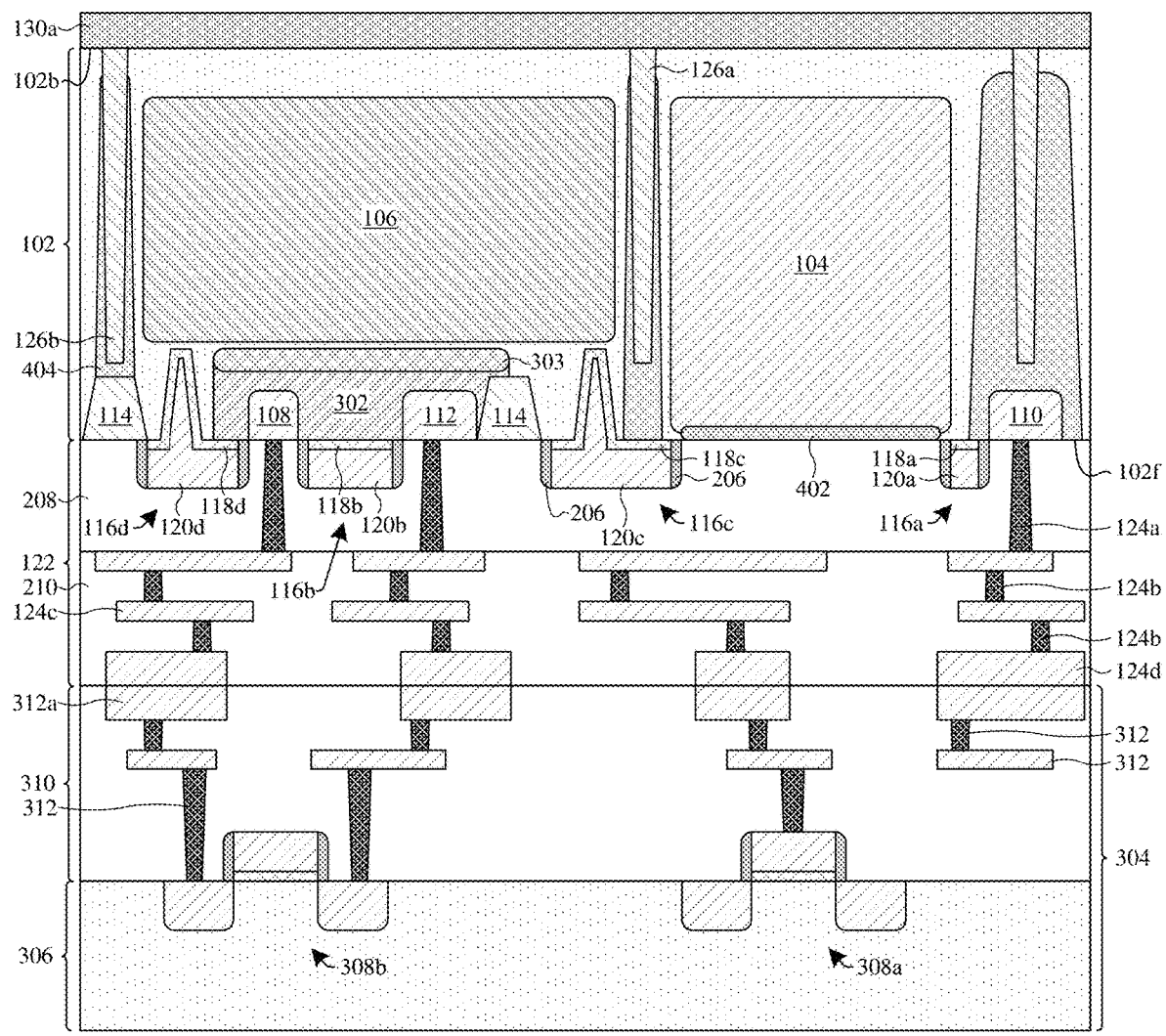

As shown in FIG. 17, a first dielectric layer 130a is formed on the back side 102b of the first semiconductor substrate 102 and the second isolation structure 126. In some embodiments, the first dielectric layer 130a may be formed by CVD, PVD, ALD, sputtering, or the like. Subsequently, in some embodiments, a planarization process (e.g., CMP) may be performed on the first dielectric layer 130a to planarize an upper surface of the first dielectric layer 130a.

Figure 18:
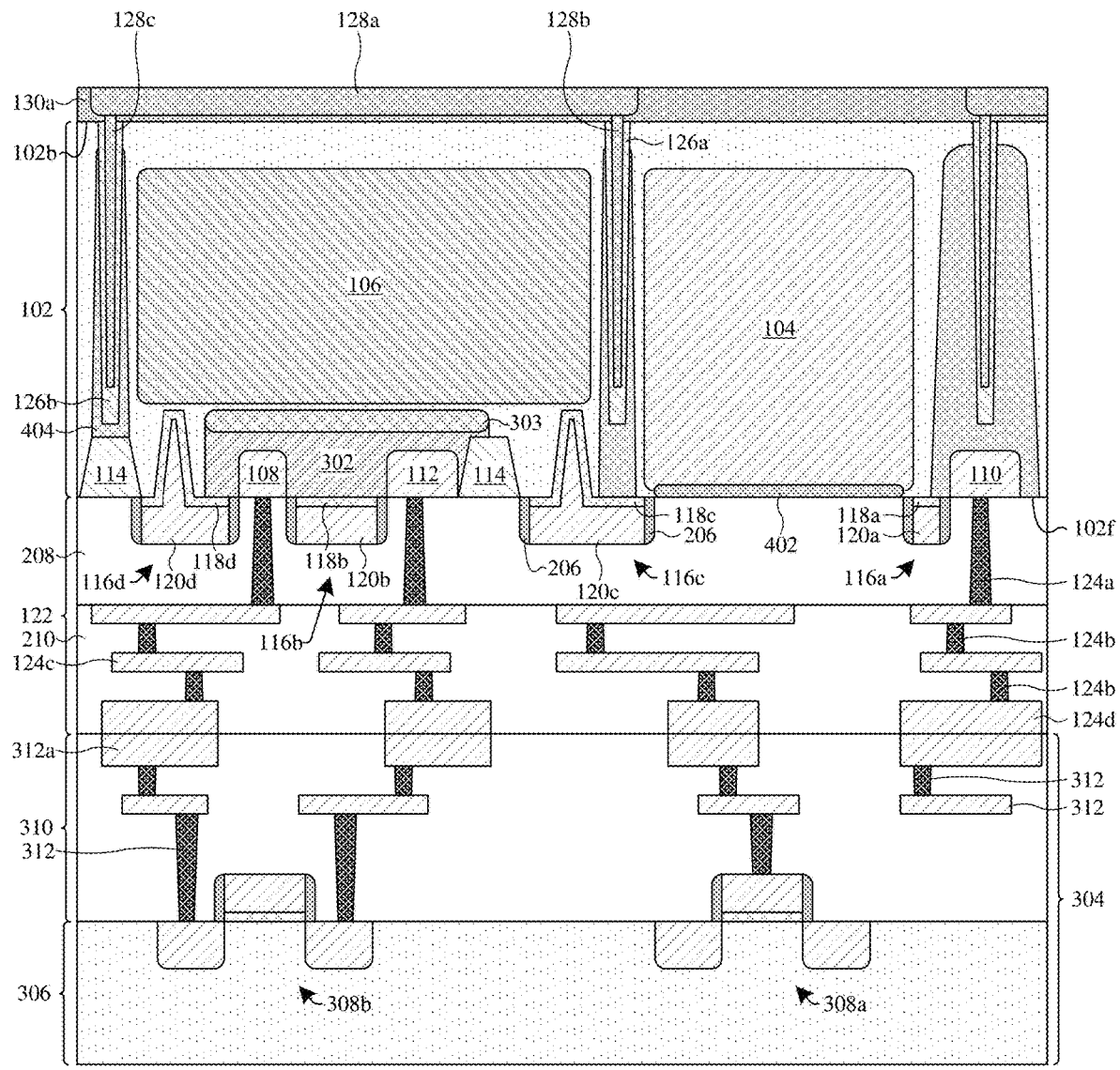

As shown in FIG. 18, a reflective structure 128 is formed on the back side 102b of the first semiconductor substrate 102. In some embodiments, the reflective structure 128 is formed extending into the first semiconductor substrate 102 from the back side 102b. For example, a first portion of the reflective structure 128a may be formed in the first dielectric layer 130a, a second portion of the reflective layer may be formed in the first portion of the second isolation structure 126a, and a third portion of the reflective structure 128c may be formed in the second portion of the second isolation structure 126b.

In some embodiments, a process for forming the reflective structure 128 comprises forming a first opening (not shown) in the first dielectric layer 130a that corresponds to the first portion of the reflective structure 128a. The first opening may be formed by a first selective etching process that utilizes a first masking layer (not shown) on the first dielectric layer 130a to selectively expose the first dielectric layer 130a to a first etchant that removes unmasked portions of the first dielectric layer 130a. Subsequently, in some embodiments, the first masking layer is stripped away.

Thereafter, a plurality of second openings are formed extending into the second isolation structure. The second openings correspond to the second portion of the reflective structure 128b and the third portion of the reflective structure 128c, respectively. The second openings may be formed by a second selective etching process that utilizes a second masking layer (not shown) on the first dielectric layer 130a to selectively expose the first dielectric layer 130a and the second isolation structure 126 to a second etchant that removes unmasked portions of the first dielectric layer 130a and unmasked portions of the second isolation structure 126. A conductive material (e.g., W, Al, Cu, etc.) is then deposited on the first dielectric layer 130a, in the first opening, and in the second openings. A planarization process (e.g., CMP) is performed into the conductive material, thereby forming the reflective structure 128. Subsequently, in some embodiments, the second masking layer is stripped away. It will be appreciated that, in some embodiments, the second masking layer may be formed on the first masking layer and the first dielectric layer 130a, and both the first masking layer and second masking layer may be stripped away after the conductive material is deposited.

Figure 19:
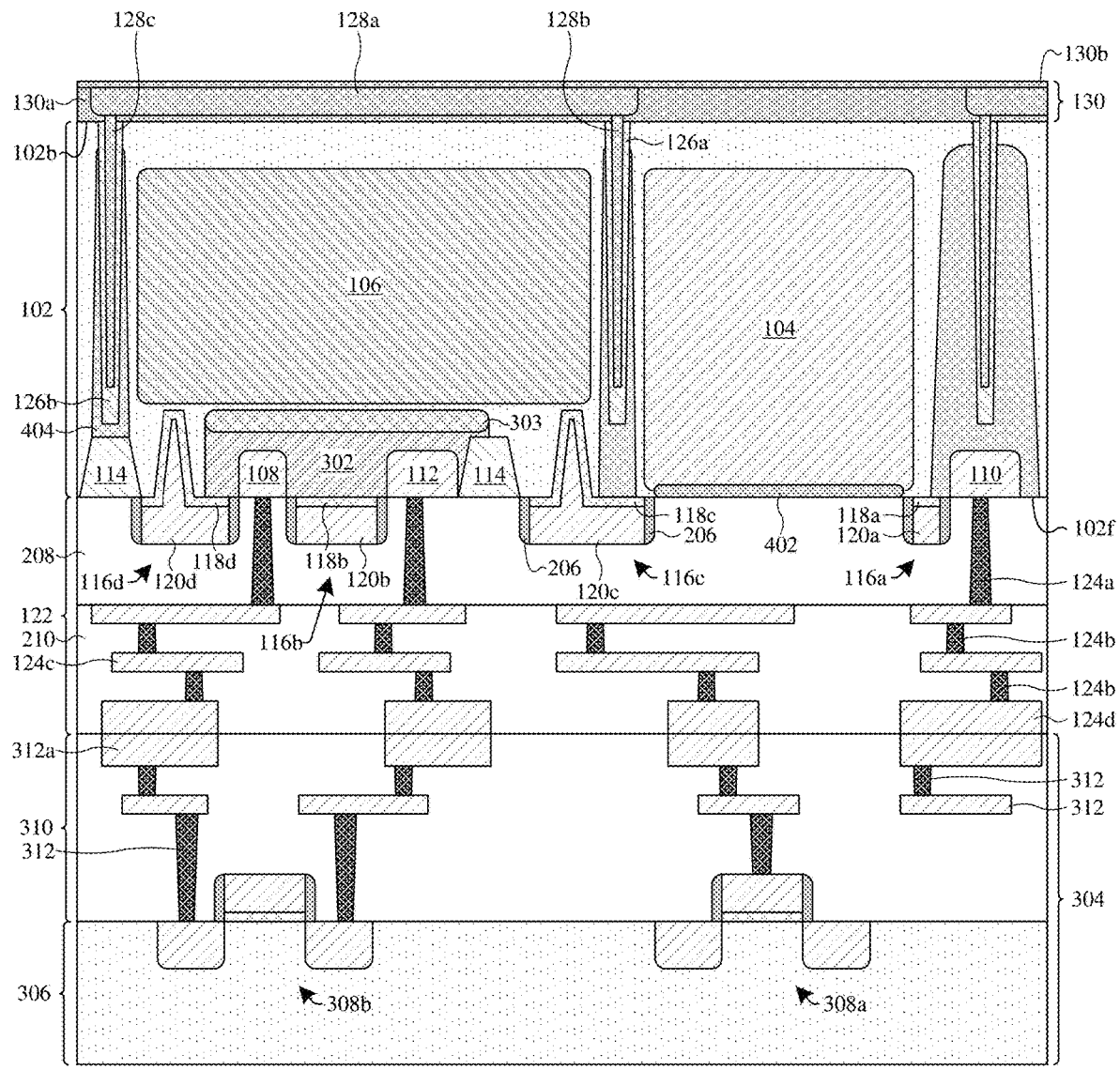

As shown in FIG. 19, a second dielectric layer 130b is formed on the first dielectric layer 130a and the reflective structure 128. In some embodiments, the second dielectric layer 130b may be formed by CVD, PVD, ALD, sputtering, or the like. Subsequently, in some embodiments, a planarization process (e.g., CMP) may be performed on the second dielectric layer 130b to planarize an upper surface of the second dielectric layer 130b. In some embodiments, after the second dielectric layer 130b is formed, formation of a dielectric structure 130 is complete. In further embodiments, the dielectric structure 130 may be a BSI anti-reflection structure that is configured to reduce an amount of the incident radiation reflected by the first semiconductor substrate 102. In other embodiments, the dielectric structure 130 may be distinct from a BSI anti-reflection structure. In such embodiments, it will be appreciated that the BSI anti-reflection layer may be formed before (or after) the dielectric structure 130 is formed (e.g., via CVD, PVD, ALD, sputtering, etc.).

Figure 20:
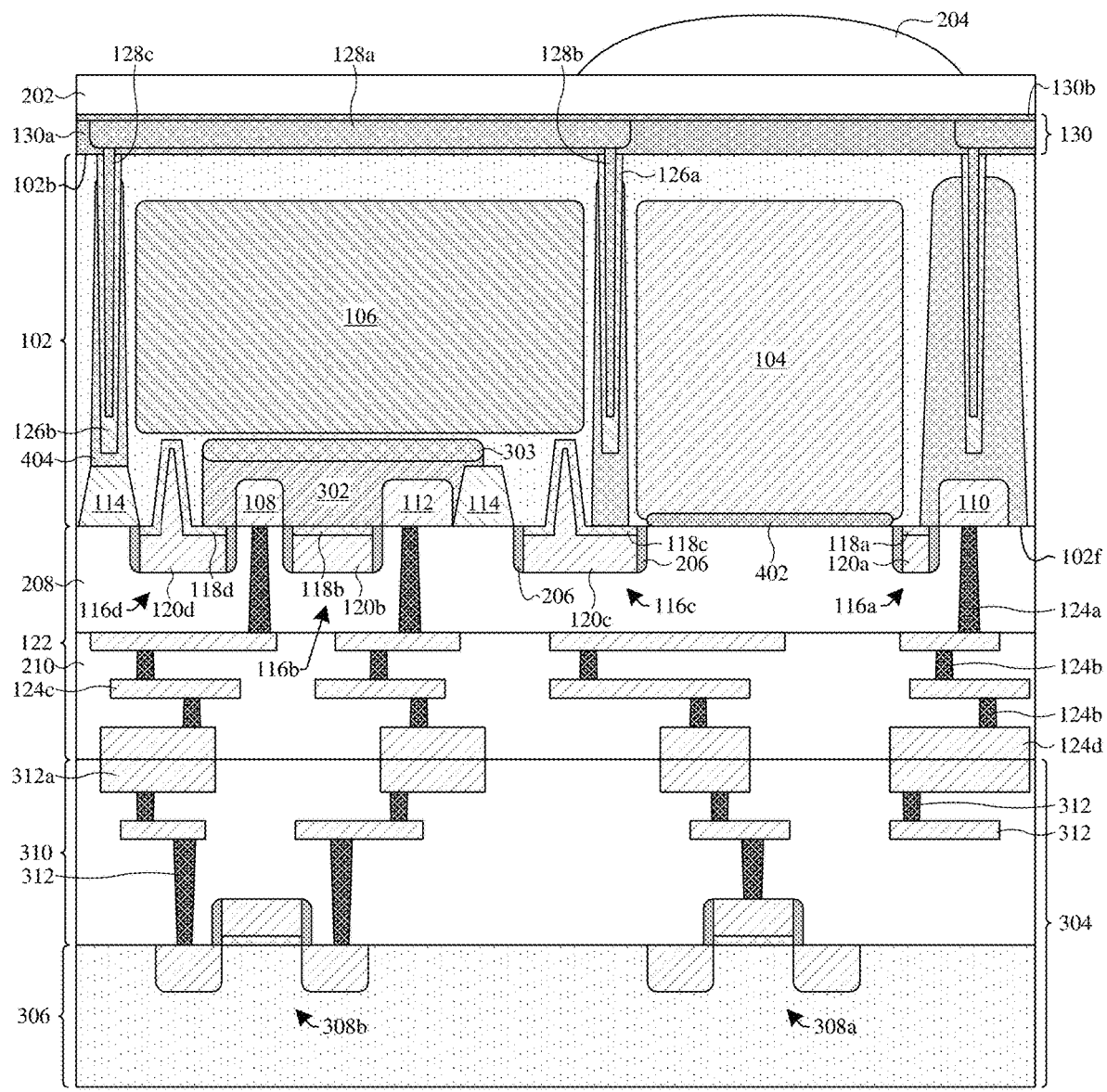

As shown in FIG. 20, a light filter 202 is formed on the dielectric structure 130. In some embodiments, the light filter 202 is formed on the second dielectric layer 130b. In some embodiments, a process for forming the light filter 202 comprises depositing (e.g., via CVD, PVD, ALD, sputtering, a spin-on process, etc.) a light filtering material onto the dielectric structure 130. The light filtering material is a material that allows for the transmission of radiation (e.g., light) having a specific wavelength range, while blocking light of wavelengths outside of the specified range. Subsequently, in some embodiments, a planarization process (e.g., CMP) may be performed into the light filter 202 to planarize an upper surface of the light filter 202.

Also shown in FIG. 20, a micro-lens 204 is formed on the light filter 202. In some embodiments, the micro-lens 204 may be formed by depositing a micro-lens material on the light filter 202 (e.g., via CVD, PVD, ALD, sputtering, a spin-on process, etc.). A micro-lens template (not shown) having a curved upper surface is patterned above the micro-lens material. In some embodiments, the micro-lens template may comprise a photoresist material exposed using a distributing exposing light dose (e.g., for a negative photoresist more light is exposed at a bottom of the curvature and less light is exposed at a top of the curvature), developed, and baked to form a rounding shape. The micro-lens 204 is then formed by selectively etching the micro-lens material according to the micro-lens template. In further embodiments, after the micro-lens 204 is formed, formation of the BSIGS image sensor 100 is complete.

FIG. 21 illustrates a flowchart 2100 of some embodiments of a method for forming a backside illuminated global shutter (BSIGS) image sensor 100. While the flowchart 2100 of FIG. 21 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 2102, a photodetector and a storage node are formed in a first semiconductor substrate, wherein the first semiconductor substrate comprises a front side and a back side opposite the front side. FIGS. 5-6 illustrate a series of cross-sectional views of some embodiments corresponding to act 2102.

At act 2104, a plurality of gates are formed on the front side of the semiconductor substrate, wherein the plurality of gates comprise a first vertical transfer gate and a second vertical transfer gate that extend into the semiconductor substrate from the front side. FIGS. 7-11 illustrate a series of cross-sectional views of some embodiments corresponding to act 2104. In some embodiments, a doped isolation region may be formed in the first semiconductor substrate before the plurality of gates are formed. FIG. 7 illustrates a cross-sectional view of some embodiments for forming the doped isolation region.

At act 2106, a floating diffusion node, a first doped region, and a second doped region are formed in the first semiconductor substrate. FIG. 12 illustrates a cross-sectional view of some embodiments corresponding to act 2106.

At act 2108, an interlayer dielectric (ILD) structure is formed on the front side of the first semiconductor substrate and over the plurality of gates. FIGS. 13-14 illustrate a series of cross-sectional views of some embodiments corresponding to act 2108.

At act 2110, a second semiconductor substrate is bonded to the first semiconductor substrate, wherein the ILD structure separates the first semiconductor substrate from the second semiconductor substrate. FIG. 15 illustrates a cross-sectional view of some embodiments corresponding to act 2110.

At act 2112, an isolation structure is formed in the first semiconductor substrate that extends into the first semiconductor substrate from the back side of the first semiconductor substrate. FIG. 16 illustrates a cross-sectional view of some embodiments corresponding to act 2112.

At act 2114, a reflective structure is formed on the back side of the first semiconductor substrate, wherein at least a portion of the reflective structure is disposed between opposite sides of the storage node. FIGS. 17-19 illustrate a series of cross-sectional views of some embodiments corresponding to act 2114. In some embodiments, a light filter and/or a micro-lens is formed on the back side of the first semiconductor substrate. FIG. 20 illustrates a cross-sectional view of some embodiments for forming the light filter and/or the micro-lens.

In some embodiments, the present application provides an image sensor. The image sensor comprises a photodetector disposed in a semiconductor substrate. An interlayer dielectric (ILD) structure is disposed on a first side of the semiconductor substrate. A storage node is disposed in the semiconductor substrate and spaced from the photodetector, wherein the storage node is spaced from the first side by a first distance. A first isolation structure is disposed in the semiconductor substrate and between the photodetector and the storage node, wherein the first isolation structure extends into the semiconductor substrate from a second side of the semiconductor substrate that is opposite the first side, and wherein the first isolation structure is spaced from the first side by a second distance that is less than the first distance.

In some embodiments, the present application provides an image sensor. The image sensor comprises a photodetector disposed in a semiconductor substrate, wherein the photodetector is spaced a first distance from a first side of the semiconductor substrate. An interlayer dielectric (ILD) structure is disposed on the first side of the semiconductor substrate. A storage node is disposed in the semiconductor substrate and spaced from the photodetector, wherein the storage node is spaced from the first side by a second distance that is greater than the first distance. A first vertical transfer gate is disposed on the first side and is configured to selectively form a first conductive channel between the photodetector and the storage node, wherein a first portion of the first vertical transfer gate extends into the semiconductor substrate from the first side a third distance, and wherein the third distance is greater than the first distance and less than the second distance.

In some embodiments, the present application provides a method for forming an image sensor. The method comprises forming a photodetector in a semiconductor substrate. A storage node is formed in the semiconductor substrate and spaced from the photodetector. A first vertical transfer gate and a second vertical transfer gate are formed on a first side of the semiconductor substrate, wherein a portion of the first vertical transfer gate and a portion of the second vertical transfer gate extend into the semiconductor substrate from the first side. An interlayer dielectric (ILD) structure is formed on the first side and over both the first vertical transfer gate and the second vertical transfer gate. An isolation structure is formed in the semiconductor substrate, wherein the isolation structure extends into the first semiconductor substrate from a second side of the semiconductor substrate that is opposite the first side. A reflective structure is formed on the second side of the semiconductor substrate, wherein at least a portion of the reflective structure is disposed between opposite sides of the storage node.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor, comprising:
a photodetector disposed in a substrate;
an interlayer dielectric (ILD) structure disposed on a first side of the substrate;
a storage node disposed in the substrate and spaced from the photodetector;
a floating diffusion node extending into the substrate from the first side of the substrate;
a vertical transfer gate extending into the substrate from the first side of the substrate, wherein a bottom of the vertical transfer gate is spaced from the first side of the substrate by a first distance, and wherein the vertical transfer gate is configured to selectively form a first conductive channel between the photodetector and the storage node; and
an isolation structure disposed in the substrate and between the photodetector and the storage node, wherein the isolation structure extends into the substrate from a second side of the substrate opposite the first side of the substrate, and wherein the isolation structure is spaced from the first side of the substrate by a second distance less than the first distance.

2. The image sensor of claim 1, wherein the storage node is vertically spaced from both the first side of the substrate and the second side of the substrate.

3. The image sensor of claim 1, further comprising:
a reset gate disposed on the first side of the substrate, wherein the floating diffusion node is disposed laterally between the reset gate and the vertical transfer gate.

4. The image sensor of claim 3, wherein the isolation structure, the reset gate, the floating diffusion node, and the vertical transfer gate are disposed on a same side of the photodetector.

5. The image sensor of claim 1, further comprising:
a reflective structure disposed on the second side of the substrate, wherein a first portion of the reflective structure is disposed at least partially between opposite sides of the storage node.

6. The image sensor of claim 5, wherein a second portion of the reflective structure is disposed in the isolation structure and extends into the substrate from the second side of the substrate.

7. The image sensor of claim 6, further comprising:
a doped region disposed in the substrate, wherein the doped region extends into the substrate from the first side of the substrate, and wherein the isolation structure is at least partially disposed in the doped region.

8. An image sensor, comprising:
a photodetector disposed in a substrate;
a storage node disposed in the substrate and spaced from the photodetector, wherein the storage node is spaced from a first side of the substrate by a first distance;
a reset gate disposed over the first side of the substrate;
a vertical transfer gate extending into the substrate from the first side of the substrate, wherein a portion of the vertical transfer gate is disposed at least partially over the first side of the substrate, and wherein the vertical transfer gate is configured to selectively form a first conductive channel between the photodetector and the storage node; and
an isolation structure disposed in the substrate and between the photodetector and the storage node, wherein the isolation structure extends into the substrate from a second side of the substrate opposite the first side of the substrate, and wherein the isolation structure is spaced from the first side of the substrate by a second distance less than the first distance.

9. The image sensor of claim 8, further comprising:
a floating diffusion node disposed in the substrate, wherein the floating diffusion node is disposed laterally between the reset gate and the vertical transfer gate.

10. The image sensor of claim 8, further comprising:
an anti-blooming gate disposed over the first side of the substrate, wherein the anti-blooming gate is laterally spaced from both the reset gate and the vertical transfer gate.

11. The image sensor of claim 10, wherein:
the anti-blooming gate is disposed on a first side of the photodetector; and
the vertical transfer gate is disposed on a second side of the photodetector opposite the first side of the photodetector.

12. The image sensor of claim 8, further comprising:
an interlayer dielectric (ILD) structure disposed on the first side of the substrate.

13. An image sensor, comprising:
a photodetector disposed in a substrate;
an interlayer dielectric (ILD) structure disposed on a first side of the substrate;
a storage node disposed in the substrate and spaced from the photodetector;
a floating diffusion node disposed in the substrate and spaced from both the photodetector and the storage node;
a first vertical transfer gate disposed on the first side of the substrate and at least partially between the photodetector and the storage node, wherein a portion of the first vertical transfer gate extends vertically into the substrate, and wherein the first vertical transfer gate is configured to selectively form a first conductive channel between the photodetector and the storage node; and
a second vertical transfer gate disposed on the first side of the substrate and laterally spaced from the first vertical transfer gate, wherein the second vertical transfer gate is disposed at least partially between the storage node and the floating diffusion node, wherein a portion of the second vertical transfer gate extends vertically into the substrate, and wherein the second vertical transfer gate is configured to selectively form a second conductive channel between the storage node and the floating diffusion node.

14. The image sensor of claim 13, wherein the storage node is disposed laterally between the photodetector and the floating diffusion node.

15. The image sensor of claim 13, further comprising:
a reflective structure disposed on a second side of the substrate opposite the first side of the substrate, wherein the reflective structure is disposed at least partially between opposite sides of the storage node.

16. The image sensor of claim 13, wherein:
the substrate has a second side opposite the first side of the substrate;
the storage node is disposed vertically between the portion of the first vertical transfer gate and the second side of the substrate; and
the storage node is disposed vertically between the portion of the second vertical transfer gate and the second side of the substrate.

17. The image sensor of claim 13, further comprising:
a doped isolation region disposed in the substrate and laterally between the portion of the first vertical transfer gate and the portion of the second vertical transfer gate, wherein the doped isolation region is disposed vertically between the storage node and the first side of the substrate, and wherein the doped isolation region has an opposite doping type than the floating diffusion node.

18. The image sensor of claim 13, wherein both the portion of the first vertical transfer gate and the portion of the second vertical transfer gate are at least partially disposed laterally between opposite sides of the storage node.

19. The image sensor of claim 13, wherein the floating diffusion node is disposed laterally between the first vertical transfer gate and the second vertical transfer gate.

20. The image sensor of claim 13, further comprising:
a reset gate disposed on the first side of the substrate, wherein the floating diffusion node is disposed laterally between the second vertical transfer gate and the reset gate, and wherein the reset gate is configured to selectively form a third conductive channel between the floating diffusion node and a doped region of the substrate.

* * * * *